(12) United States Patent
Shin et al.

(10) Patent No.: US 12,597,288 B2
(45) Date of Patent: Apr. 7, 2026

(54) DISPLAY DEVICE

(71) Applicant: Samsung Display Co., Ltd., Yongin-Si (KR)

(72) Inventors: Dong Hee Shin, Yongin-si (KR); Sang Yong No, Yongin-si (KR); Sun Kwun Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/014,240

(22) Filed: Jan. 9, 2025

(65) Prior Publication Data

US 2025/0308281 A1     Oct. 2, 2025

(30) Foreign Application Priority Data

Apr. 2, 2024     (KR) ......................... 10-2024-0044699

(51) Int. Cl.
*G06V 40/13* (2022.01)
*H10K 59/65* (2023.01)

(52) U.S. Cl.
CPC ......... *G06V 40/1318* (2022.01); *H10K 59/65* (2023.02)

(58) Field of Classification Search
CPC .... G06V 40/1318; H10K 59/65; H10K 59/60; G02F 1/13318; G09G 2360/141; G09G 2360/144; G09G 2360/147
See application file for complete search history.

(56) References Cited

U.S. PATENT DOCUMENTS

| | | | |
|---|---|---|---|
| 11,276,743 B2 | 3/2022 | Cho et al. | |
| 12,046,070 B2 | 7/2024 | Kim et al. | |
| 2009/0135167 A1 * | 5/2009 | Sakai .................. | G02F 1/13318 |
| | | | 345/207 |
| 2020/0111851 A1 * | 4/2020 | Park ......................... | G06F 21/32 |
| 2020/0334438 A1 * | 10/2020 | Cheng ................ | G06V 40/1318 |
| 2022/0028934 A1 * | 1/2022 | Kim ...................... | H10K 59/352 |

FOREIGN PATENT DOCUMENTS

| | | |
|---|---|---|
| KR | 10-2022-0014351 A | 2/2022 |
| KR | 10-2022-0165105 A | 12/2022 |

* cited by examiner

*Primary Examiner* — Abhishek Sarma
(74) *Attorney, Agent, or Firm* — Innovation Counsel LLP

(57)     ABSTRACT

Provided is a display device including an illuminance sensor. The illuminance sensor includes a read-out line disposed on a substrate and extending in a first direction, a light receiving element disposed on the read-out line, a first sensor transistor configured to control a sensing current based on a voltage of a sensor node, which is a first electrode of the light receiving element, a second sensor transistor configured to supply a reset voltage to the sensor node based on a reset signal, a third sensor transistor configured to electrically connect a first electrode of the first sensor transistor to the read-out line based on a gate signal, and a sensor capacitor comprising a first capacitor electrode electrically connected to the first electrode of the first sensor transistor, and a second capacitor electrode overlapping the first capacitor electrode and electrically connected to the first electrode of the light receiving element.

20 Claims, 23 Drawing Sheets

ACTL1 : SE2, ACT2, DE2, SE1, ACT1, DE1
GTL1 : GE2, GE1, CST1
GTL2 : CST2
ACTL2 : DE3, ACT3, SE3
GTL3 : GE3
SDL1 : CE1, CE2, CE3
SDL2 : DCE
SDL3 : DL

ACTL1 : PACT3-1, PDE3-1, PSE3-2, PACT3-2, PDE3-2
GTL1 : PGE3-1, PGE3-2
SDL1 : ROE1
SDL2 : ROE2
SDL3 : ROL

ACTL1 : PACT1
GTL1 : GRL, PGE1
ACTL2 : PDE2, PACT2, PSE2
GTL3 : PGE2, CGL
SDL1 : NSE1, VIL2
SDL2 : NSE2
SDL3 : NSE3

ACTL1 : PACT1, CSS1
GTL1 : GRL, PGE1
ACTL2 : PDE2, PACT2, PSE2
GTL3 : PGE2, CGL
SDL1 : NSE1, VIL2, CSS2
SDL2 : NSE2
SDL3 : NSE3

DISPLAY DEVICE

CROSS-REFERENCE TO RELATED APPLICATION

This application claims priority to Korean Patent Application No. 10-2024-0044699 filed on Apr. 2, 2024, and all the benefits accruing therefrom under 35 U.S.C. § 119, the content of which in its entirety is herein incorporated by reference.

BACKGROUND

1. Technical Field

The present disclosure relates to an illuminance sensor and a display device including the same.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. In the display device, since each of pixels of a display panel includes a light emitting element capable of emitting light by itself, an image can be displayed without a backlight unit providing light to the display panel.

The display device may include a display panel that displays an image, an optical sensor that detects light, a fingerprint sensor that detects a person's fingerprint, and an illuminance sensor that detects surrounding brightness. With diversification of electronic devices employing display devices, it is required for the display devices to be provided in various designs. For example, the display device may expand a display area for displaying images by removing a sensor device such as a separate optical sensor, fingerprint sensor, or illuminance sensor.

SUMMARY

Aspects of the present disclosure provide an illuminance sensor capable of preventing discharge of a light receiving element when a large amount of light is incident, and a display device including the same.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the present disclosure, an illuminance sensor includes a read-out line disposed on a substrate and extending in a first direction, a light receiving element disposed on the read-out line, a first sensor transistor configured to control a sensing current based on a voltage of a sensor node, which is a first electrode of the light receiving element, a second sensor transistor configured to supply a reset voltage to the sensor node in response to a reset signal, a third sensor transistor configured to electrically connect a first electrode of the first sensor transistor to the read-out line in response to a gate signal, and a sensor capacitor comprising a first capacitor electrode electrically connected to the first electrode of the first sensor transistor, and a second capacitor electrode overlapping the first capacitor electrode and electrically connected to the first electrode of the light receiving element.

The first capacitor electrode may be formed integrally with the first electrode of the first sensor transistor.

The third sensor transistor may include a third-first sensor transistor and a third-second sensor transistor connected in series between the read-out line and the first electrode of the first sensor transistor.

The first capacitor electrode may be formed integrally with a drain electrode of the third-second sensor transistor.

The illuminance sensor may further include a first read-out electrode disposed in the same layer as the second capacitor electrode and connected to a first electrode of the third-first sensor transistor, and a second read-out electrode disposed on the first read-out electrode and electrically connecting the first read-out electrode to the read-out line.

The illuminance sensor may further include a first sensor node electrode formed integrally with the second capacitor electrode and electrically connected to a gate electrode of the first sensor transistor.

The illuminance sensor may further include a second sensor node electrode disposed on the first sensor node electrode and connected to the first sensor node electrode, and a third sensor node electrode disposed on the second sensor node electrode and electrically connecting the second sensor node electrode to the first electrode of the light receiving element.

A semiconductor region of each of the first sensor transistor and the third sensor transistor may include a silicon-based material, and a semiconductor region of the second sensor transistor may include an oxide-based material.

The illuminance sensor may further include a first active layer disposed on the substrate and comprising a semiconductor region of each of the first sensor transistor and the third sensor transistor, a first gate layer disposed on the first active layer, a second gate layer disposed on the first gate layer, a second active layer disposed on the second gate layer and comprising a semiconductor region of the second sensor transistor, a third gate layer disposed on the second active layer, a first source metal layer disposed on the third gate layer, a second source metal layer disposed on the first source metal layer, and a third source metal layer disposed on the second source metal layer and comprising the read-out line.

The first capacitor electrode may be disposed in the first active layer, and the second capacitor electrode is disposed in the first source metal layer.

According to an embodiment of the present disclosure, a display device includes a first display area comprising a pixel comprising a light emitting element and a fingerprint sensor which receives light incident on a fingerprint sensor area to recognize a pattern of a user's fingerprint, and a second display area disposed adjacent to the first display area, and comprising an illuminance sensor which receives light incident on an illuminance sensor area to measure surrounding brightness. Each of the fingerprint sensor and the illuminance sensor includes a read-out line disposed on a substrate and extending in a first direction, a light receiving element disposed on the read-out line, a first sensor transistor configured to control a sensing current based on a voltage of a sensor node which is connected to the light receiving element, a second sensor transistor configured to supply a reset voltage to the sensor node in response to a reset signal, and a third sensor transistor configured to electrically connect a first electrode of the first sensor transistor to the read-out line in response to a gate signal. The illuminance sensor further includes a sensor capacitor comprising a first capacitor electrode electrically connected to the first electrode of the first sensor transistor, and a second capacitor electrode overlapping the first capacitor electrode and electrically connected to the first electrode of the light receiving element.

The light emitting element of the pixel, the light receiving element of the fingerprint sensor, and the light receiving element of the illuminance sensor may be disposed in the same layer.

A size of the illuminance sensor area may be smaller than a size of the fingerprint sensor area.

A light receiving layer of the illuminance sensor may receive light having a wavelength band wider than that of a light receiving layer of the fingerprint sensor.

The first capacitor electrode may be formed integrally with the first electrode of the first sensor transistor of the illuminance sensor.

The third sensor transistor may include a third-first sensor transistor and a third-second sensor transistor connected in series between the read-out line and the first electrode of the first sensor transistor. The first capacitor electrode may be formed integrally with a drain electrode of the third-second sensor transistor of the illuminance sensor.

The illuminance sensor may further include a first read-out electrode disposed in the same layer as the second capacitor electrode and connected to a first electrode of the third-first sensor transistor, and a second read-out electrode disposed on the first read-out electrode and electrically connecting the first read-out electrode to the read-out line.

The illuminance sensor may further include a first sensor node electrode formed integrally with the second capacitor electrode and electrically connected to a gate electrode of the first sensor transistor.

The illuminance sensor may further include a second sensor node electrode disposed on the first sensor node electrode and connected to the first sensor node electrode, and a third sensor node electrode disposed on the second sensor node electrode and electrically connecting the second sensor node electrode to the first electrode of the light receiving element.

A semiconductor region of each of the first sensor transistor and the third sensor transistor may include a silicon-based material, and a semiconductor region of the second sensor transistor may include an oxide-based material.

According to an embodiment of the disclosure, since a sensor capacitor is provided between a first electrode of the light receiving element and a first electrode of a first sensor transistor, it is possible to prevent discharge of the light receiving element when a large amount of light is incident, thereby improving the sensitivity of the sensor.

It should be noted that effects of the present disclosure are not limited to those described above and other effects of the present disclosure will be apparent to those skilled in the art from the following descriptions.

BRIEF DESCRIPTION OF THE DRAWINGS

The above and other features of the inventive concept will become more apparent by describing in detail embodiments thereof with reference to the accompanying drawings, in which.

DETAILED DESCRIPTION OF THE EMBODIMENTS

Figure 1:
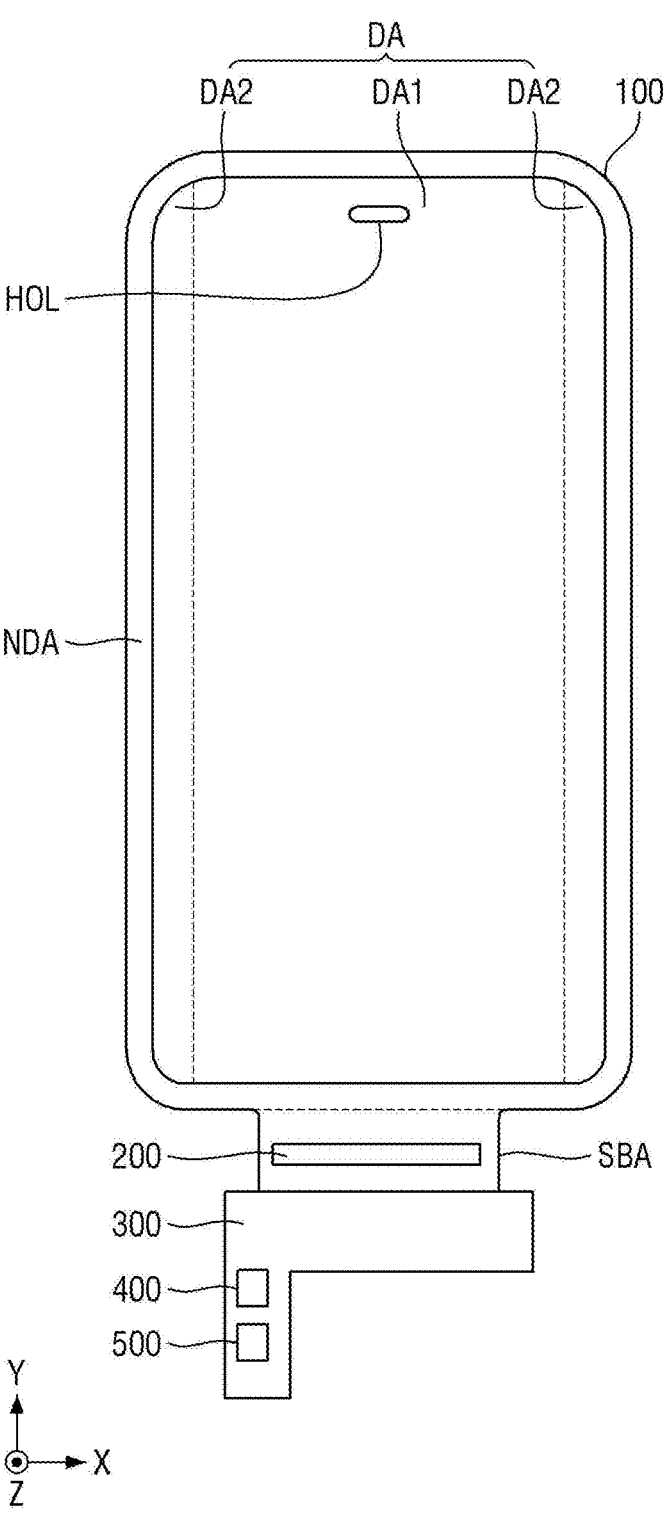
FIG. 1 is a plan view illustrating a display device according to one embodiment.

Embodiments of the present disclosure address a problem in which any of a plurality of touch lines overlapping data fan-out line or scan fan-out line produce a parasitic capacitance between the touch line and the data fan-out line or between the touch line and the scan fan-out line. Due to the parasitic capacitance, a touch signal of the touch line may be affected by a data voltage of the data fan-out line or a scan control signal of the scan fan-out line, and thus, a touch sensing error may occur.

Embodiments of the present disclosure provide a display device capable of preventing a touch signal of a touch line from being affected by a data voltage of a data fan-out line or a scan control signal of a scan fan-out line.

The present disclosure now will be described more fully hereinafter with reference to the accompanying drawings, in which various embodiments are shown. This present disclosure may, however, be embodied in many different forms, and should not be construed as limited to the embodiments set forth herein. Rather, these embodiments are provided so that this disclosure will be thorough and complete, and will fully convey the scope of the present disclosure to those skilled in the art. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers or sections, these elements, components, regions, layers or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

As used herein, the terms "comprises," "comprising," "includes," and "including" mean the presence of stated features, regions, integers, steps, operations, elements, or components, but do not preclude the presence or addition of one or more other features, regions, integers, steps, operations, elements, components, or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described in detail with reference to the accompanying drawings.

FIG. 1 is a plan view illustrating a display device according to one embodiment.

Referring to FIG. 1, the display device may be applied to portable electronic devices such as a mobile phone, a smartphone, a tablet personal computer, a mobile communication terminal, an electronic organizer, an electronic book, a portable multimedia player (PMP), a navigation system, and an ultra-mobile PC (UMPC), or may be applied to wearable devices such as a smart watch and a watch phone.

The display device may have a planar shape similar to a quadrilateral shape. For example, the display device may have a shape similar to a quadrilateral shape, in a plan view, having short sides in an X-axis direction and long sides in a Y-axis direction. The corner where the short side in the X-axis direction and the long side in the Y-axis direction meet may be rounded to have a predetermined curvature or may be right-angled. The planar shape of the display device is not limited to a quadrilateral shape, and may be formed in a shape similar to another polygonal shape, a circular shape, or elliptical shape.

The display device may include a display panel 100, a display driver 200, a circuit board 300, a touch driver 400, and a power supply unit 500.

The display panel 100 may include a display area DA, a hole HOL, and a non-display area NDA. The display area DA may include pixels for displaying an image. The display area DA may emit light through a plurality of emission areas or a plurality of opening areas. For example, the display area DA may include a pixel circuit including switching elements, a pixel defining film defining an emission area or an opening area, and a self-light emitting element.

For example, the self-light emitting element may include one of an organic light emitting diode (LED) including an organic light emitting layer, a quantum dot LED including a quantum dot light emitting layer, an inorganic LED including an inorganic semiconductor, and a micro LED, but the configuration of the self-light emitting element is not limited thereto.

The display area DA may include a first display area DA1 and a second display area DA2. The first display area DA1 may occupy a relatively large portion of the display area DA. The first display area DA1 may include a plurality of pixels to display an image and may include a plurality of fingerprint sensors to recognize a user's fingerprint pattern. The second display area DA2 may be disposed adjacent to the first display area DA1. The second display area DA2 may be disposed at the left edge and the right edge of the first display area DA1, but locations of the second display area DA2 are not limited thereto. The second display area DA2 may include a plurality of pixels to display an image and may include a plurality of illuminance sensors to measure brightness around the display device.

The hole HOL may be disposed at one edge of the display area DA, but the location of the hole HOL is not limited thereto. The hole HOL may be surrounded by the first display area DA1. The hole HOL may be formed through at least a portion of the display panel 100 to improve light transmission efficiency. The display device may include at least one of a front camera, a face recognition camera, an infrared camera, a proximity sensor, an illuminance sensor, an iris sensor, or a fingerprint recognition sensor, which is disposed under the display panel 100 in an area corresponding to the hole HOL. Accordingly, in the display device, a plurality of cameras or a plurality of sensors may be disposed in the area in which the hole HOL is disposed.

The non-display area NDA may be disposed around the display area DA. The non-display area NDA may be defined as an edge area of the display panel 100. A gate driver (not illustrated) that supplies gate signals to the gate lines and fan-out lines (not illustrated) that connect the display driver 200 to the display area DA may be disposed in the non-display area NDA.

The sub-region SBA may extend from one side of the non-display area NDA. The sub-region SBA may include a flexible material which can be bent, folded or rolled. For example, when the sub-region SBA is bent, the sub-region SBA may overlap the display area DA in a thickness direction (Z-axis direction). The sub-region SBA may include the display driver 200 and a pad portion connected to the circuit board 300. Optionally, the sub-region SBA may be omitted, and the display driver 200 and the pad portion may be disposed in the non-display area NDA.

The display driver 200 may output signals and voltages for driving the display panel 100. The display driver 200 may supply data voltages to data lines. The display driver 200 may supply a power voltage to the power line and may supply a gate control signal to the gate driver. The display driver 200 may be formed as an integrated circuit (IC) and mounted on the display panel 100 by a chip on glass (COG) method, a chip on plastic (COP) method, or an ultrasonic bonding method. For example, the display driver 200 may be disposed in the sub-region SBA, and may overlap the display area DA in the thickness direction (Z-axis direction) when the sub-region SBA is bent. For another example, the display driver 200 may be mounted on the circuit board 300.

The circuit board 300 may be attached to the pad portion of the display panel 100 by using an anisotropic conductive film (ACF). Lead lines of the circuit board 300 may be electrically connected to the pad portion of the display panel 100. The circuit board 300 may be a flexible printed circuit board, a printed circuit board, or a flexible film such as a chip on film.

The touch driver 400 may be mounted on the circuit board 300. The touch driver 400 may be electrically connected to a touch sensing unit of the display panel 100. The touch driver 400 may supply a touch driving signal to a plurality of touch electrodes of the touch sensing unit and may sense an amount of change in capacitance between the plurality of touch electrodes. For example, the touch driving signal may be a pulse signal having a predetermined frequency. The touch driver 400 may calculate whether an input is made and input coordinates based on an amount of change in capacitance between the plurality of touch electrodes. The touch driver 400 may be formed as an integrated circuit (IC).

The power supply unit 500 may be disposed on the circuit board 300 to supply a power voltage to the display driver 200 and the display panel 100. The power supply unit 500 may generate a driving voltage to supply it to a driving voltage line, and may generate a common voltage to supply it to a common electrode that is common to the light emitting elements of a plurality of pixels. For example, the driving voltage may be a high potential voltage for driving the light emitting element, and the common voltage may be a low potential voltage for driving the light emitting element. The power supply unit 500 may generate an initialization voltage to supply it to an initialization voltage line, generate a reference voltage to supply it to a reference voltage line, generate a bias voltage to supply it to a bias voltage line, and generate a reset voltage to supply it to a reset voltage line.

Figure 2:
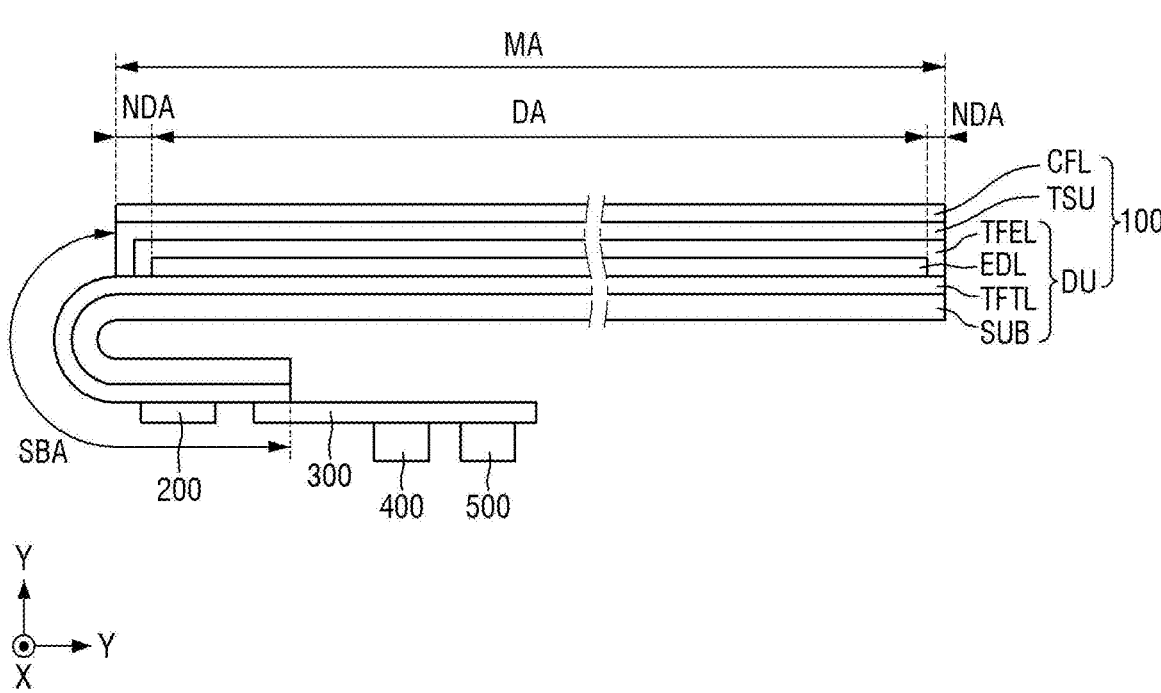
FIG. 2 is a cross-sectional view illustrating a display device according to one embodiment.

FIG. 2 is a cross-sectional view illustrating a display device according to one embodiment.

Referring to FIG. 2, the display panel 100 may include a display unit DU, a touch sensing unit TSU, and a color filter layer CFL. The display unit DU may include a substrate SUB, a transistor layer TFTL, a light emitting element layer EDL, and an encapsulation layer TFEL.

The substrate SUB may be a base substrate or a base member. The substrate SUB may be a flexible substrate which can be bent, folded or rolled. For example, the substrate SUB may include a polymer resin such as polyimide (PI), but the configuration of the substrate SUB is not limited thereto. For another example, the substrate SUB may include a glass material or a metal material.

The transistor layer TFTL may be disposed on the substrate SUB. The transistor layer TFTL may include a plurality of transistors constituting a pixel, a fingerprint sensor, and an illuminance sensor. The transistor layer TFTL may further include gate lines, data lines, power lines, read-out lines, gate control lines, fan-out lines that connect the display driver 200 to the data lines, and lead lines that connect the display driver 200 to the pad portion. Each of the transistors may include a semiconductor region, a source electrode, a drain electrode, and a gate electrode. For example, when the gate driver is formed on one side of the non-display area NDA of the display panel 100, the gate driver may include transistors.

The transistor layer TFTL may be disposed in the display area DA, the non-display area NDA, and the sub-region SBA. The transistors, gate lines, data lines, power lines, and read-out lines of the transistor layer TFTL may be disposed in the display area DA. Gate control lines and fan-out lines of the transistor layer TFTL may be disposed in the non-display area NDA. The lead lines of the transistor layer TFTL may be disposed in the sub-region SBA.

The light emitting element layer EDL may be disposed on the transistor layer TFTL. The light emitting element layer EDL may include a light emitting element of a pixel, a light receiving element of a fingerprint sensor, a light receiving element of an illuminance sensor, and a pixel defining film that defines light emitting areas and/or light receiving areas of the pixels, the fingerprint sensor, and the illuminance sensor. The light emitting element may emit light and include a pixel electrode, a light emitting layer, and a common electrode sequentially stacked, and the light receiving element may receive light and include a sensor electrode, a light receiving layer, and a common electrode sequentially stacked. The light emitting elements and light receiving elements of the light emitting element layer EDL may be disposed in the display area DA.

For example, the light emitting layer may be an organic light emitting layer including an organic material. The light emitting layer may include a hole transporting layer, an organic light emitting layer, and an electron transporting layer. When the pixel electrode receives a predetermined voltage through the transistor of the transistor layer TFTL and the common electrode receives a cathode voltage, holes may move to the organic light emitting layer through the hole transporting layer, electrons may move to the organic light emitting layer through the electron transporting layer, and the holes and the electrons may combine with each other in the organic light emitting layer to emit light. For example, the pixel electrode may be an anode electrode, and the common electrode may be a cathode electrode, but the present disclosure is not limited thereto.

For another example, the plurality of light emitting elements may include a quantum dot light emitting diode including a quantum dot light emitting layer, an inorganic light emitting diode including an inorganic semiconductor, or a micro light emitting diode.

The light receiving element may receive light and convert light energy into an electrical signal. When a user's finger touches the display panel 100, light emitted from the light emitting element may be reflected by the finger, and the light receiving element may receive the reflected light. A sensing signal of the fingerprint sensor that receives light reflected by the ridges of the finger may be different from a sensing signal of the fingerprint sensor that receives light reflected by the valleys of the finger. The main processor may distinguish the difference between these sensing signals to generate sensing data, and based on the sensing data, may determine whether the ridges of the finger have been touched or the valleys of the finger have been touched. Accordingly, the display device may recognize the pattern of the user's fingerprint based on the sensing data. For example, the light receiving element may be an organic photodiode, but is not limited thereto.

When external light is incident on the display panel 100, the light receiving element may receive the external light. The magnitude of a sensing signal of the illuminance sensor may vary according to the intensity of external light. The main processor may generate the sensing data by distinguishing the difference between the sensing signals, and measure the brightness around the display device based on the sensing data.

For example, the light receiving layer of the fingerprint sensor may receive green light, and the light receiving layer of the illuminance sensor may receive red light or green light. Accordingly, the light receiving layer of the illuminance sensor may receive light having a wavelength band wider than that of the light receiving layer of the fingerprint sensor.

The encapsulation layer TFEL may cover the top surface and the side surface of the light emitting element layer EDL, and may protect the light emitting element layer EDL. The encapsulation layer TFEL may include at least one inorganic film and at least one organic film for encapsulating the light emitting element layer EDL.

The touch sensing unit TSU may be disposed on the encapsulation layer TFEL. The touch sensing unit TSU may include a plurality of touch electrodes for sensing a user's touch in a capacitive manner, and touch lines connecting the plurality of touch electrodes to the touch driver 400. The plurality of touch electrodes of the touch sensing unit TSU may be disposed in a touch sensor area overlapping the display area DA. The touch lines of the touch sensing unit TSU may be disposed in a touch peripheral area that overlaps the non-display area NDA. For example, the touch sensing unit TSU may sense the user's touch by using a mutual capacitance method or a self-capacitance method.

For another example, the touch sensing unit TSU may be disposed on a separate substrate disposed on the display unit DU. In this case, the substrate supporting the touch sensing unit TSU may be a base member that encapsulates the display unit DU.

The color filter layer CFL may be disposed on the touch sensing unit TSU. The color filter layer CFL may include a plurality of color filters respectively corresponding to the plurality of emission areas. Each of the color filters may selectively transmit light of a specific wavelength and may block or absorb light of a different wavelength. The color filter layer CFL may absorb a portion of light coming from the outside of the display device to reduce reflected light due to external light. Accordingly, the color filter layer CFL may prevent color distortion caused by reflection of the external light.

Since the color filter layer CFL is directly disposed on the touch sensing unit TSU, the display device may not require a separate substrate for the color filter layer CFL. Therefore, the thickness of the display device may be relatively reduced.

The sub-region SBA of the display panel 100 may extend from one side of the main region MA. The sub-region SBA may include a flexible material which can be bent, folded or rolled. For example, when the sub-region SBA is bent, the sub-region SBA may overlap the main region MA in a thickness direction (Z-axis direction). The sub-region SBA may include the display driver 200 and the pad portion electrically connected to the circuit board 300.

Figure 3:
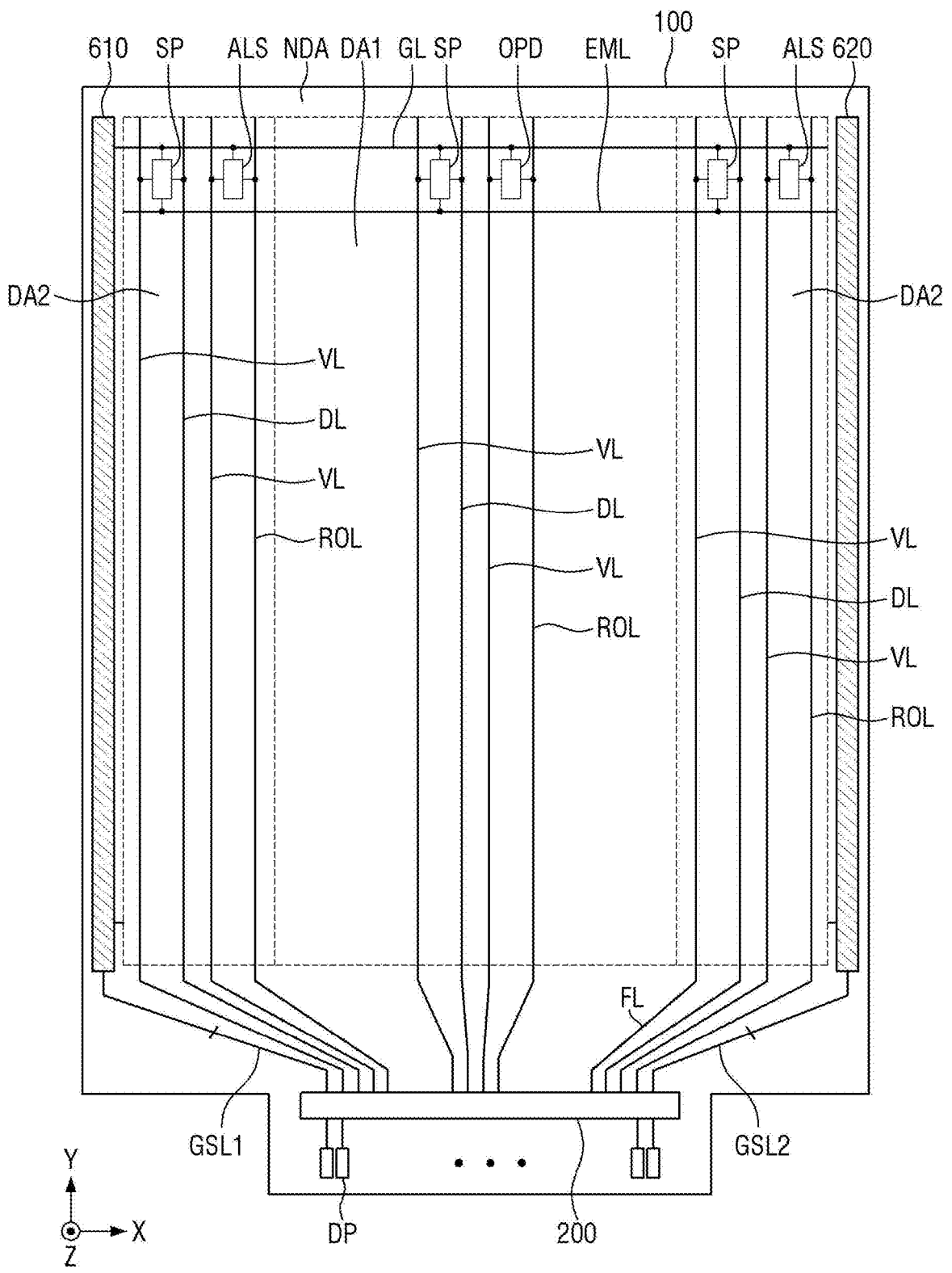
FIG. 3 is a plan view illustrating a display unit of a display device according to one embodiment.
Figure 4:
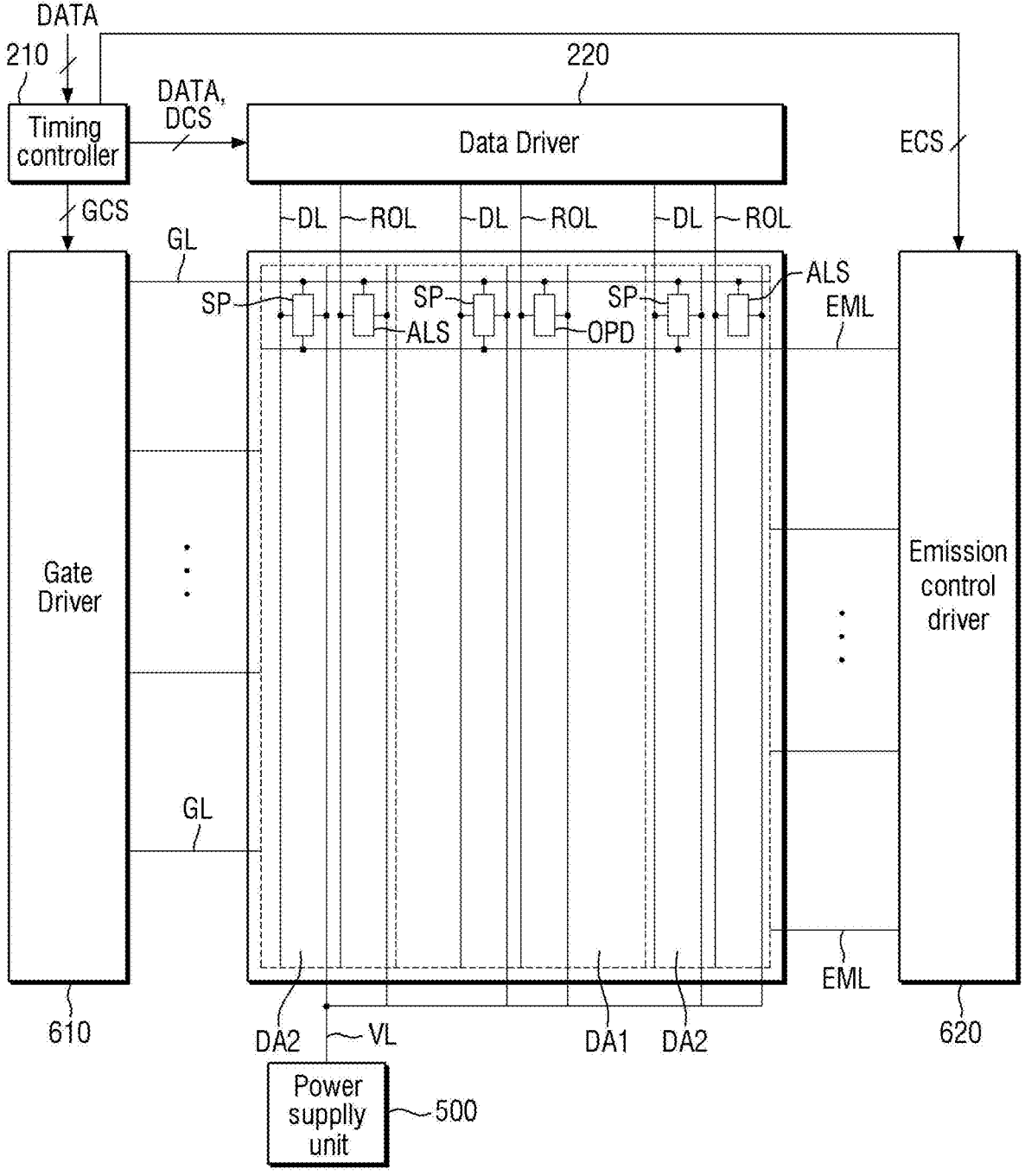
FIG. 4 is a block diagram illustrating a display panel and a display driver according to one embodiment.

FIG. 3 is a plan view illustrating a display unit of a display device according to one embodiment. FIG. 4 is a block diagram illustrating a display panel and a display driver according to one embodiment.

Referring to FIGS. 3 and 4, the display panel 100 may include the display area DA and the non-display area NDA. The display area DA may include the first display area DA1 and the second display area DA2. The first display area DA1 may include pixels SP, fingerprint sensors OPD, power lines VL, data lines DL, read-out lines ROL, gate lines GL, and emission control lines EML. The second display area DA2 may include pixels SP, illuminance sensors ALS, power lines VL, data lines DL, read-out lines ROL, gate lines GL, and emission control lines EML.

Each of the plurality of pixels SP may be connected to a gate line GL, a emission control line EML, a data line DL, and the a line VL. Each of the pixels SP may include at least one transistor, a light emitting element and a capacitor.

Each of the plurality of fingerprint sensors OPD may be connected to a gate line GL, a power line VL, and a read-out line ROL. Each of the plurality of fingerprint sensors OPD may include at least one transistor and the light receiving element.

Each of the plurality of illuminance sensors ALS may be connected to a gate line GL, a power line VL, and a read-out line ROL. Each of the plurality of illuminance sensors ALS may include at least one transistor and the light receiving element.

The gate lines GL may extend in the X-axis direction and may be spaced apart from each other in the Y-axis direction that crosses the X-axis direction. The gate lines GL may sequentially supply gate signals to the pixels SP, the fingerprint sensors OPD, and the illuminance sensors ALS.

The emission control lines EML may extend in the X-axis direction and may be spaced apart from each other in the Y-axis direction. The emission control lines EML may sequentially supply emission signals to the pixels SP.

The data lines DL may extend in the Y-axis direction and may be spaced apart from each other in the X-axis direction. The data lines DL may supply the data voltage to the pixels SP. The data voltage may determine the luminance of each of the pixels SP.

The power lines VL may extend in the Y-axis direction and may be spaced apart from each other in the X-axis direction. The power lines VL may supply the power voltage to the pixels SP, the fingerprint sensors OPD, and the illuminance sensors ALS. Here, the power voltage may be a driving voltage, a common voltage, an initialization voltage, a reference voltage, a bias voltage, or a reset voltage. The driving voltage may be a high potential voltage for driving the light emitting element, and the common voltage may be a low potential voltage for driving the light emitting element and the light receiving element.

The non-display area NDA may surround the display area DA. A gate driver 610, an emission control driver 620, fan-out lines FL, a first gate control line GSL1, and a second gate control line GSL2 may be disposed in non-display area NDA.

The fan-out lines FL may extend from the display driver 200 to the display area DA. The fan-out lines FL may supply the data voltages received from the display driver 200 to the data lines DL, supply the power voltages received from the display driver 200 to the power lines VL, and supply the sensing signals received from the read-out lines ROL to the display driver 200. Accordingly, the display driver 200 may drive the pixel SP, the fingerprint sensor OPD, and the illuminance sensor ALS.

The first gate control line GSL1 may extend from the display driver 200 to the gate driver 610. The first gate control line GSL1 may supply a gate control signal GCS received from the display driver 200 to the gate driver 610.

The second gate control line GSL2 may extend from the display driver 200 to the emission control driver 620. The second gate control line GSL2 may supply an emission control signal ECS received from the display driver 200 to the emission control driver 620.

The sub-region SBA may extend from one side of the non-display area NDA. The sub-region SBA may include the display driver 200 and the pad portion DP. The pad portion DP may be disposed closer to one edge of the sub-region SBA than the display driver 200. The pad portion DP may be electrically connected to the circuit board 300 through an anisotropic conductive film (ACF).

The display driver 200 may include a timing controller 210 and a data driver 220.

The timing controller 210 may receive digital video data DATA and timing signals from the circuit board 300. The timing controller 210 may generate, based on the timing signals, a data control signal DCS to control the operation timing of the data driver 220, the gate control signal GCS to control the operation timing of the gate driver 610, and the emission control signal ECS to control the operation timing of the emission control driver 620. The timing controller 210 may supply the gate control signal GCS to the gate driver 610 through the first gate control line GSL1. The timing controller 210 may supply the emission control signal ECS to the emission control driver 620 through the second gate control line GSL2. The timing controller 210 may supply the digital video data DATA and the data control signal DCS to the data driver 220.

The data driver 220 may convert the digital video data DATA into analog data voltages and supply them to the data lines DL through the fan-out lines FL. The gate signals of the gate driver 610 may select pixels SP to which the data voltage is supplied, and the selected pixels SP may receive the data voltage through the data lines DL. The data driver 220 may supply a sensing signal received through the read-out line ROL to the main processor.

The power supply unit 500 may be disposed on the circuit board 300 to supply a power voltage to the display driver 200 and the display panel 100. The power supply unit 500 may generate a power voltage and supply it to the power line VL, and generate a common voltage and supply it to the common electrode that is common to the pixels SP, the fingerprint sensors OPD, and the illuminance sensors ALS. The power supply unit 500 may generate an initialization voltage and supply it to an initialization voltage line, generate a reference voltage and supply it to a reference voltage line, generate a bias voltage and supply it to a bias voltage line, and generate a reset voltage and supply it to a reset voltage line.

The gate driver 610 may be disposed in one side of the display area DA in the non-display area NDA. The emission control driver 620 may be disposed in another side of the display area DA in the non-display area NDA. However, the present disclosure is not limited thereto. As another example, the gate driver 610 and the emission control driver 620 may be disposed in any one of the non-display area NDA.

The gate driver 610 may include a plurality of transistors for generating gate signals in response to the gate control signal GCS. The emission control driver 620 may include a plurality of transistors for generating emission signals in response to the emission control signal ECS. For example, the transistors of the gate driver 610 and the transistors of the emission control driver 620 may be formed in the same layer as the transistors of each pixel SP. The gate driver 610 may supply the gate signals to the gate lines GL, and the emission control driver 620 may supply the emission signals to the emission control lines EML.

Figure 5:
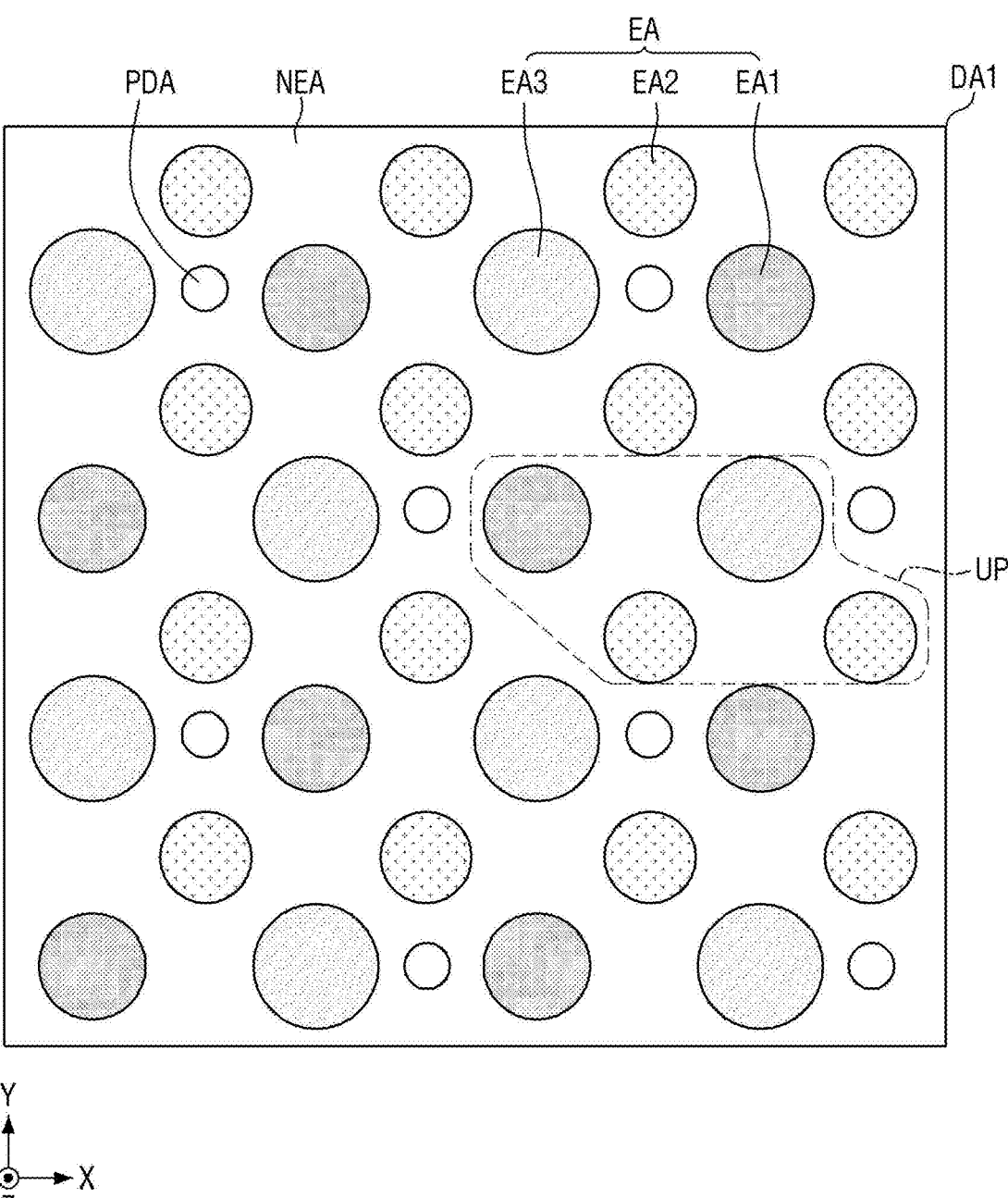
FIG. 5 is a plan view illustrating a first display area of a display device according to one embodiment.

FIG. 5 is a plan view illustrating a first display area of a display device according to one embodiment.

Referring to FIG. 5, the first display area DA1 may include emission areas EA and a non-emission area NEA which is a remaining portion of the second display area DA2 except the emission areas EA. The emission areas EA may include the light emitting elements, and the light emitting elements may not be disposed in the non-emission area NEA. The non-emission area NEA may include fingerprint sensor areas PDA spaced apart from each other with at least one emission area EA disposed therebetween. The emission areas EA may include first to third emission areas EA1, EA2, and EA3. For example, the first emission area EA1 may emit light of a first color or red light, the second emission area EA2 may emit light of a second color or green light, and the third emission area EA3 may emit light of a third color or blue light, but the configuration of the emission area EA is not limited thereto.

One unit pixel UP may include one first emission area EA1, two second emission areas EA2, and one third emission area EA3 to represent a white gray scale, but the configuration of the unit pixel UP is not limited thereto. The white gray scale may be represented by a combination of light emitted from one first emission area EA1, light emitted from two second emission areas EA2, and light emitted from one third emission area EA3.

The first to third emission areas EA1, EA2, and EA3 may be different in size from each other. For example, the size of the third emission area EA3 may be larger than that of the first emission area EA1, and the size of the first emission area EA1 may be larger than that of the second emission area EA2. However, the present disclosure is not limited thereto. As another example, the sizes of the first to third emission areas EA1, EA2, and EA3 may be the same.

The fingerprint sensor area PDA may be surrounded by the first to third emission areas EA1, EA2, and EA3. The fingerprint sensor area PDA may be disposed adjacent to the first or third emission area EA1 or EA3 in the X-axis direction, and may be disposed adjacent to the second emission area EA2 in the Y-axis direction. The fingerprint sensor areas PDA may be spaced apart from each other with at least one emission area EA disposed therebetween. The fingerprint sensor area PDA may receive light reflected by the finger.

Figure 6:
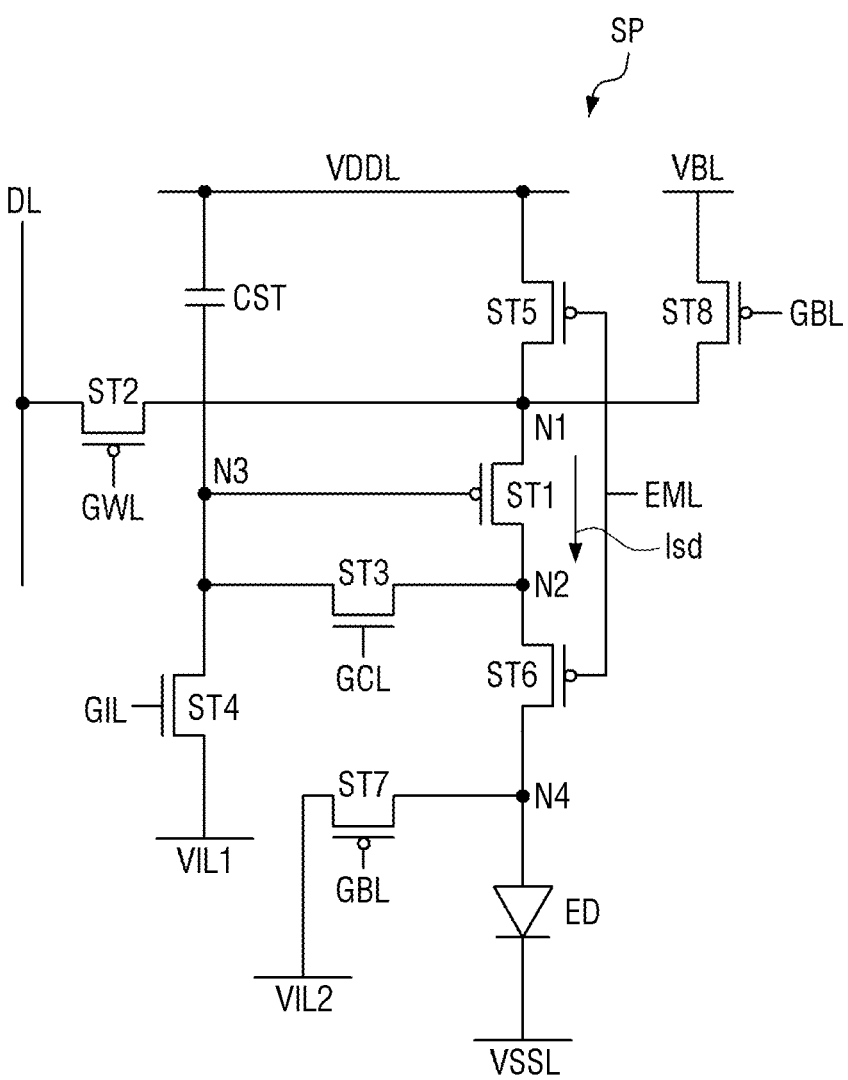
FIG. 6 is a circuit diagram illustrating a pixel of a display device according to one embodiment.

FIG. 6 is a circuit diagram illustrating a pixel of a display device according to one embodiment.

Referring to FIG. 6, the pixel SP may be connected to a first gate line GWL, a second gate line GCL, a third gate line GIL, a fourth gate line GBL, the emission control line EML, the data line DL, a driving voltage line VDDL, a first initialization voltage line VIL1, a second initialization voltage line VIL2, and a low potential line VSSL.

The pixel SP may include a light emitting element ED and a pixel circuit for driving the light emitting element ED. The pixel circuit may include first to eighth transistors ST1, ST2, ST3, ST4, ST5, ST6, ST7, and ST8 and one storage capacitor CST.

The first transistor ST1 may control a driving current supplied to the light emitting element ED. The first transistor ST1 may include a gate electrode, a first electrode, and a second electrode. The gate electrode of the first transistor ST1 may be connected to a third node N3, the first electrode thereof may be connected to a first node N1, and the second electrode thereof may be connected to a second node N2. For example, the first electrode of the first transistor ST1 may be a source electrode and the second electrode thereof may be a drain electrode, but the present disclosure is not limited thereto.

The first transistor ST1 may control a source-drain current Isd (hereinafter, referred to as "driving current") according to the data voltage applied to the gate electrode. The driving current Isd flowing through the channel of the first transistor ST1 may be proportional to the square of a difference between a threshold voltage Vth and a voltage Vgs between the gate electrode and the source electrode of the first transistor ST1 ($Isd = k \times (Vgs - Vth)^2$). Here, k is a proportional coefficient determined by the structure and physical characteristics of the first transistor ST1, Vgs is a gate-source voltage of the first transistor ST1, and Vth is a threshold voltage of the first transistor ST1.

The light emitting element ED may emit light by receiving the driving current Isd. The emission amount or the luminance of the light emitting element ED may be proportional to the magnitude of the driving current Isd. The light emitting element ED may include a first electrode, a second electrode, and a light emitting layer disposed between the first electrode and the second electrode. The first electrode of the light emitting element ED may be connected to a fourth node N4. The first electrode of the light emitting element ED may be connected to the second electrode of the sixth transistor ST6 and the first electrode of the seventh transistor ST7 through the fourth node N4. For example, the first electrode of the light emitting element ED may be an anode electrode or a pixel electrode, and the second electrode thereof may be a cathode electrode or a common electrode, but the present disclosure is not limited thereto.

The second transistor ST2 may be turned in response to the first gate signal of the first gate line GWL to electrically connect the data line DL to the first node N1 which is the first electrode of the first transistor ST1. The second transistor ST2 may be turned on in response to the first gate signal to supply the data voltage to the first node N1. The gate electrode of the second transistor ST2 may be connected to the first gate line GWL, the first electrode thereof may be connected to the data line DL, and the second electrode thereof may be connected to the first node N1. The second electrode of the second transistor ST2 may be connected to the first electrode of the first transistor ST1, the second electrode of the fifth transistor ST5, and the second electrode of the eighth transistor ST8 through the first node N1. For example, the first electrode of the second transistor ST2 may be a source electrode and the second electrode thereof may be a drain electrode, but the present disclosure is not limited thereto.

The third transistor ST3 may be turned on in response to the second gate signal of the second gate line GCL to electrically connect the second node N2, which is the second electrode of the first transistor ST1, to the third node N3, which is the gate electrode the first transistor ST1. The gate electrode of the third transistor ST3 may be connected to the second gate line GCL, the first electrode thereof may be connected to the second node N2, and the second electrode thereof may be connected to the third node N3. The first electrode of the third transistor ST3 may be connected to the second electrode of the first transistor ST1 and the first electrode of the sixth transistor ST6 through the second node N2. The second electrode of the third transistor ST3 may be connected to the gate electrode of the first transistor ST1, the first electrode of the fourth transistor ST4, and a first capacitor electrode of the storage capacitor CST through the third node N3. For example, the first electrode of the third transistor ST3 may be a drain electrode and the second electrode thereof may be a source electrode, but the configuration of the third transistor ST3 is not limited thereto.

The fourth transistor ST4 may be turned on in response to a third gate signal of the third gate line GIL to electrically connect the third node N3, which is connected to the gate electrode of the first transistor ST1, to the first initialization voltage line VIL1. The fourth transistor ST4 may be turned on in response to the third gate signal, thereby discharging the gate electrode of the first transistor ST1 to a first initialization voltage. The gate electrode of the fourth transistor ST4 may be connected to the third gate line GIL, the first electrode thereof may be connected to the third node N3, and the second electrode thereof may be connected to the first initialization voltage line VIL1. The first electrode of the fourth transistor ST4 may be connected to the gate electrode of the first transistor ST1, the second electrode of the third transistor ST3, and the first capacitor electrode of the storage capacitor CST through the third node N3. For example, the first electrode of the fourth transistor ST4 may be a drain electrode and the second electrode thereof may be a source electrode, but the configuration of the fourth transistor ST4 is not limited thereto.

The fifth transistor ST5 may be turned on in response to an emission signal of the emission control line EML to electrically connect the driving voltage line VDDL with the first node N1 that is the first electrode of the first transistor ST1. The gate electrode of the fifth transistor ST5 may be connected to the emission control line EML, the first electrode thereof may be connected to the driving voltage line VDDL, and the second electrode thereof may be connected to the first node N1. The second electrode of the fifth transistor ST5 may be electrically connected to the first electrode of the first transistor ST1, the second electrode of the second transistor ST2, and the second electrode of the eighth transistor ST8 through the first node N1. For example, the first electrode of the fifth transistor ST5 may be a source electrode and the second electrode thereof may be a drain electrode, but the present disclosure is not limited thereto.

The sixth transistor ST6 may be turned on in response to the emission signal of the emission control line EML to electrically connect the second node N2 that is the second electrode of the first transistor ST1 with the fourth node N4 that is the first electrode of the light emitting element ED. The gate electrode of the sixth transistor ST6 may be connected to the emission control line EML, the first electrode thereof may be connected to the second node N2, and the second electrode thereof may be connected to the fourth node N4. The first electrode of the sixth transistor ST6 may be connected to the second electrode of the first transistor ST1 and the first electrode of the third transistor ST3 through the second node N2. The second electrode of the sixth transistor ST6 may be connected to the first electrode of the light emitting element ED and the first electrode of the seventh transistor ST7 through the fourth node N4. For example, the first electrode of the sixth transistor ST6 may be a source electrode and the second electrode thereof may be a drain electrode, but the present disclosure is not limited thereto.

When all of the fifth transistor ST5, the first transistor ST1, and the sixth transistor ST6 are turned on, the driving current Isd may be supplied to the plurality of light emitting elements ED.

The seventh transistor ST7 may be turned on in response to the fourth gate signal of the fourth gate line GBL to electrically connect the second initialization voltage line VIL2 to the fourth node N4, which is the first electrode of the light emitting element ED. By turning on the seventh transistor ST7 in response to the fourth gate signal, the first electrode of the light emitting element ED may be discharged to a second initialization voltage. The gate electrode of the seventh transistor ST7 may be connected to the fourth gate line GBL, the first electrode thereof may be connected to the fourth node N4, and the second electrode thereof may be connected to the second initialization voltage line VIL2. The first electrode of the seventh transistor ST7 may be connected to the first electrode of the light emitting element ED and the second electrode of the sixth transistor ST6 through the fourth node N4.

The eighth transistor ST8 may be turned on in response to the fourth gate signal of the fourth gate line GBL to electrically connect the bias voltage line VBL with the first node N1 that is the source electrode of the first transistor ST1. The eighth transistor ST8 may be turned on in response to the fourth gate signal to supply a bias voltage to the first node N1. The eighth transistor ST8 may improve hysteresis of the first transistor ST1 by supplying the bias voltage to the source electrode of the first transistor ST1. The gate electrode of the eighth transistor ST8 may be connected to the fourth gate line GBL, the first electrode thereof may be connected to the bias voltage line VBL, and the second electrode thereof may be connected to the first node N1. The second electrode of the eighth transistor ST8 may be electrically connected to the first electrode of the first transistor ST1, the second electrode of the second transistor ST2, and the second electrode of the fifth transistor ST5 through the first node N1. For example, the first electrode of the eighth transistor ST8 may be a source electrode and the second electrode thereof may be a drain electrode, but the present disclosure is not limited thereto.

Each of the first transistor ST1, the second transistor ST2, the fifth transistor ST5, the sixth transistor ST6, the seventh transistor ST7, and the eighth transistor ST8 may include a silicon-based semiconductor region. For example, each of the first transistor ST1, the second transistor ST2, the fifth transistor ST5, the sixth transistor ST6, the seventh transistor ST7, and the eighth transistor ST8 may include a semiconductor region made of low temperature polycrystalline silicon (LTPS). The semiconductor region made of low temperature polycrystalline silicon may have high electron mobility and excellent turn-on characteristics. Accordingly, since the display device includes the first transistor ST1, the second transistor ST2, the fifth transistor ST5, the sixth transistor ST6, the seventh transistor ST7, and the eighth transistor ST8 having excellent turn-on characteristics, a plurality of pixels SP can be driven stably and efficiently.

Each of the first, second, fifth, sixth, seventh, and eighth transistors ST1, ST2, ST5, ST6, ST7, and ST8 may be a p-type transistor. For example, each of the first transistor ST1, the second transistor ST2, the fifth transistor ST5, the sixth transistor ST6, the seventh transistor ST7, and the eighth transistor ST8 may output a current flowing into the first electrode to the second electrode in response to a gate low voltage applied to the gate electrode.

Each of the third transistor ST3 and the fourth transistor ST4 may include an oxide-based semiconductor region. For example, each of the third transistor ST3 and the fourth transistor ST4 may have a coplanar structure in which the gate electrode is disposed on the oxide-based semiconductor region. The transistor having the coplanar structure may have excellent leakage current characteristics and perform low frequency driving, thereby reducing power consumption. Accordingly, the display device may include the third transistor ST3 and the fourth transistor ST4 having excellent leakage current characteristics, thereby preventing a leakage current from flowing in the pixel, and stably maintaining the voltage in the pixel.

Each of the third transistor ST3 and the fourth transistor ST4 may be an n-type transistor. For example, each of the third transistor ST3 and the fourth transistor ST4 may output a current flowing into the first electrode to the second electrode in response to a gate high voltage applied to the gate electrode.

The storage capacitor CST may be connected between the third node N3, which is connected to the gate electrode of the first transistor ST1, and the driving voltage line VDDL. For example, the first capacitor electrode of the storage capacitor CST may be connected to the third node N3, and the second capacitor electrode of the storage capacitor CST may be connected to the driving voltage line VDDL, thereby maintaining a potential difference between the driving voltage line VDDL and the gate electrode of the first transistor ST1.

Figure 7:
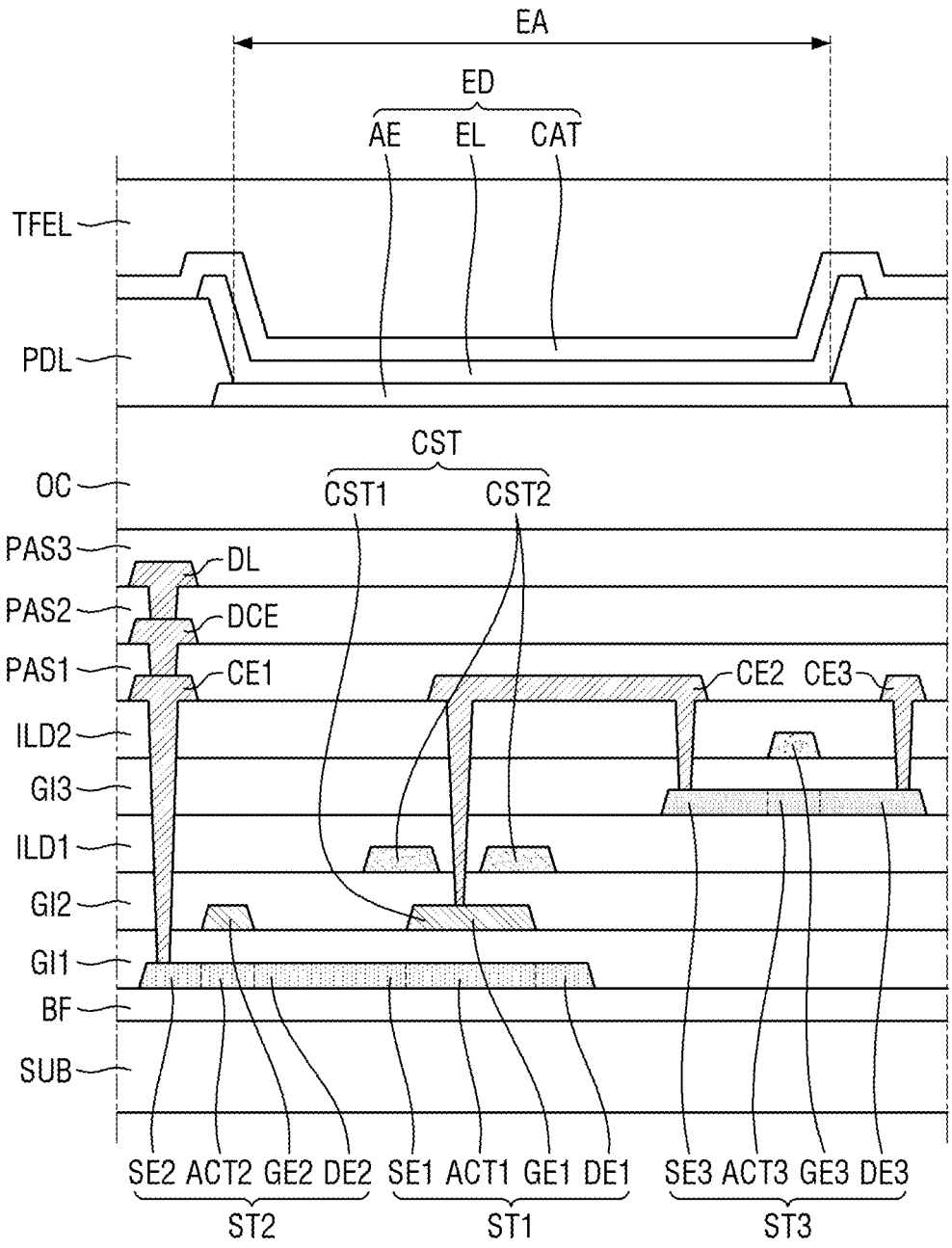
FIG. 7 is a cross-sectional view illustrating a pixel of a display device according to one embodiment.

FIG. 7 is a cross-sectional view illustrating a pixel of a display device according to one embodiment.

Referring to FIG. 7, the display panel 100 may include the substrate SUB, a buffer layer BF, a first active layer ACTL1, a first gate insulating layer GI1, a first gate layer GTL1, a second gate insulating layer GI2, a second gate layer GTL2, a first interlayer insulating layer ILD1, a second active layer ACT2, a third gate insulating layer GI3, a third gate layer GTL3, a second interlayer insulating layer ILD2, a first source metal layer SDL1, a first passivation layer PAS1, a second source metal layer SDL2, a second passivation layer PAS2, a third passivation layer PAS3, a planarization layer OC, a pixel defining film PDL, the light emitting element ED, and the encapsulation layer TFEL.

The substrate SUB may be a base substrate or a base member. The substrate SUB may be a flexible substrate which can be bent, folded or rolled. For example, the substrate SUB may include a polymer resin such as polyimide (PI), but the configuration of the substrate SUB is not limited thereto. For another example, the substrate SUB may include a glass material or a metal material.

The buffer layer BF may be disposed on the substrate SUB. For example, the buffer layer BF may include an inorganic film capable of preventing permeation of air or moisture. For example, the buffer layer BF may include a plurality of inorganic films laminated alternately.

The first active layer ACTL1 may be disposed on the buffer layer BF. The first active layer ACTL1 may include a silicon-based material. For example, the first active layer ACTL1 may be formed of low temperature polycrystalline silicon (LTPS). The first active layer ACTL1 may include the semiconductor region ACT1, the first electrode SE1, and the second electrode DE1 of the first transistor ST1, and the semiconductor region ACT2, the first electrode SE2, and the second electrode DE2 of the second transistor ST2.

The first gate insulating layer GI1 may be disposed on the first active layer ACTL1. The first gate insulating layer GI1 may insulate the first active layer ACTL1 from the first gate layer GTL1.

The first gate layer GTL1 may be disposed on the first gate insulating layer GI1. The first gate layer GTL1 may include the gate electrode GE1 of the first transistor ST1, the gate electrode GE2 of the second transistor ST2, and a first capacitor electrode CST1. The gate electrode GE1 of the first transistor ST1 may be a portion of the first capacitor electrode CST1, and the gate electrode GE2 of the second transistor ST2 may be a portion of the first gate line GWL.

The second gate insulating layer GI2 may be disposed on the first gate layer GTL1. The second gate insulating layer GI2 may insulate the first gate layer GTL1 from the second gate layer GTL2.

The second gate layer GTL2 may be disposed on the second gate insulating layer GI2. The second gate layer GTL2 may include a second capacitor electrode CST2. The second capacitor electrode CST2 may overlap the first capacitor electrode CST1.

The first interlayer insulating layer ILD1 may be disposed on the second gate layer GTL2. The first interlayer insulating layer ILD1 may insulate the second gate layer GTL2 from the second active layer ACTL2.

The second active layer ACTL2 may be disposed on the first interlayer insulating layer ILD1. The second active layer ACTL2 may include an oxide-based material. The second active layer ACTL2 may include the semiconductor region ACT3, the first electrode DE3, and the second electrode SE3 of the third transistor ST3.

The third gate insulating layer GI3 may be disposed on the second active layer ACTL2. The third gate insulating layer GI3 may insulate the second active layer ACTL2 from the third gate layer GTL3.

The third gate layer GTL3 may be disposed on the third gate insulating layer GI3. The third gate layer GTL3 may include a gate electrode GE3 of the third transistor ST3. The gate electrode GE3 of the third transistor ST3 may be a portion of the second gate line GCL.

The second interlayer insulating layer ILD2 may be disposed on the third gate layer GTL3. The second interlayer insulating layer ILD2 may insulate the third gate layer GTL3 from the first source metal layer SDL1.

The first source metal layer SDL1 may be disposed on the second interlayer insulating layer ILD2. The first source metal layer SDL1 may include first to third connection electrodes CE1, CE2, and CE3. The first connection electrode CE1 may electrically connect the data connection electrode DCE to the first electrode SE2 of the second transistor ST2. The second connection electrode CE2 may electrically connect the first capacitor electrode CST1 to the second electrode SE3 of the third transistor ST3. The third connection electrode CE3 may electrically connect the first electrode DE3 of the third transistor ST3 to the second electrode DE1 of the first transistor ST1.

The first passivation layer PAS1 may be disposed on the first source metal layer SDL1. The first passivation layer PAS1 may insulate the first source metal layer SDL1 from the second source metal layer SDL2.

The second source metal layer SDL2 may be disposed on the first passivation layer PAS1. The second source metal layer SDL2 may include the data connection electrode DCE. The data connection electrode DCE may electrically connect the first connection electrode CE1 to the data line DL.

The second passivation layer PAS2 may be disposed on the second source metal layer SDL2. The second passivation layer PAS2 may insulate the second source metal layer SDL2 from the third source metal layer SDL3.

The third source metal layer SDL3 may be disposed on the second passivation layer PAS2. The third source metal layer SDL3 may include the data line DL.

The third passivation layer PAS3 may be disposed on the third source metal layer SDL3, and the planarization layer OC may be disposed on the third passivation layer PAS3. The planarization layer OC may planarize the top of the transistor layer TFTL. The planarization layer OC may include an organic insulating material such as polyimide (PI).

The pixel defining film PDL may be disposed on the planarization layer OC. The pixel defining film PDL may define a plurality of emission areas EA. The pixel defining film PDL may include an organic insulating material such as polyimide (PI).

The light emitting element ED may include the pixel electrode AE, a light emitting layer EL, and a common electrode CAT. The pixel electrode AE may be disposed on the planarization layer OC. The pixel electrode AE may overlap one of the plurality of emission areas EA defined by the pixel defining film PDL. The pixel electrode AE may receive a driving current from the pixel circuit of the pixel SP.

The light emitting layer EL may be disposed on the pixel electrode AE. For example, the light emitting layer EL may be an organic light emitting layer made of an organic material, but the configuration of the light emitting layer EL is not limited thereto. In the case where the light emitting layer EL is the organic light emitting layer, when the pixel circuit of the pixel SP applies a predetermined voltage to the pixel electrode AE, and the common electrode CAT receives the common voltage or a cathode voltage, holes and electrons may move to the organic light emitting layer EL through a hole transporting layer and an electron transporting layer, respectively, and the holes and electrons may combine with each other in the organic light emitting layer EL to emit light.

The common electrode CAT may be disposed on the light emitting layer EL. For example, the common electrode CAT may be made in the form of an electrode common to all of the pixels SP, rather than being specific to each of the pixels SP. The common electrode CAT may be disposed on the light emitting layer EL in a plurality of emission areas, and may be disposed on the pixel defining film PDL in an area except the emission areas.

The encapsulation layer TFEL may be disposed on the common electrode CAT to cover the plurality of light emitting elements ED. The encapsulation layer TFEL may include at least one inorganic film to prevent oxygen or moisture from permeating into the plurality of light emitting elements ED. The encapsulation layer TFEL may include at least one organic film to protect the plurality of light emitting elements ED from foreign matters such as dust.

Figure 8:
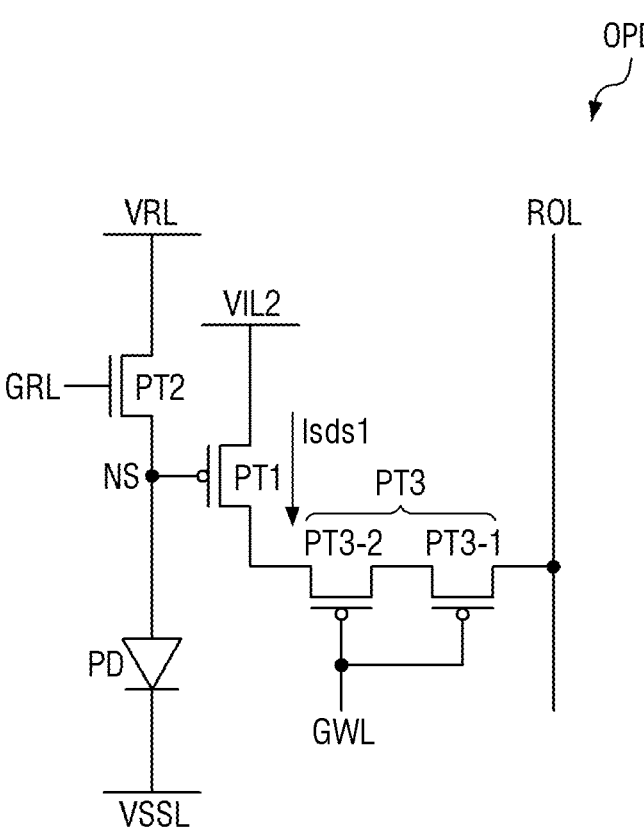
FIG. 8 is a circuit diagram of a fingerprint sensor of a display device according to one embodiment.

FIG. 8 is a circuit diagram of a fingerprint sensor of a display device according to one embodiment.

Referring to FIG. 8, the fingerprint sensor OPD may be connected to the first gate line GWL, the reset signal line GRL, the reset voltage line VRL, the second initialization voltage line VIL2, and the read-out line ROL.

The fingerprint sensor OPD may include a light receiving element PD and a fingerprint sensor circuit for driving the light receiving element PD. The fingerprint sensor circuit may include first to third sensor transistors PT1, PT2, and PT3.

The first sensor transistor PT1 may include a gate electrode, a first electrode, and a second electrode. The gate electrode of the first sensor transistor PT1 may be connected to a sensor node NS, the first electrode thereof may be connected to the third sensor transistor PT3, and the second electrode thereof may be connected to the second initialization voltage line VIL2. The first sensor transistor PT1 may control the source-drain current Isds1 (hereinafter referred to as "sensing current") based on the voltage of the sensor node NS, which is .connected to the first electrode of the light receiving element PD. The sensing current Isds1 flowing through the channel of the first sensor transistor PT1 may be proportional to the square of a difference between the threshold voltage Vth and the voltage Vgs between the gate electrode and the source electrode of the first sensor transistor PT1 ($Isds1=k'\times(Vgs-Vth)^2$). Here, k' is a proportional coefficient determined by the structure and physical characteristics of the first sensor transistor PT1, Vgs is a gate-source voltage of the first sensor transistor PT1, and Vth is a threshold voltage of the first sensor transistor PT1. The first electrode of the first sensor transistor PT1 may be a source electrode and the second electrode thereof may be a drain electrode, but the present disclosure is not limited thereto.

The second sensor transistor PT2 may be turned in response to the reset signal of the reset signal line GRL to supply a reset voltage to the sensor node NS. The gate electrode of the second sensor transistor PT2 may be connected to the reset signal line GRL, the first electrode thereof may be connected to the reset voltage line VRL, and the second electrode thereof may be connected to the sensor node NS. The second electrode of the second sensor transistor PT2 may be connected to the first electrode of the light receiving element PD and the gate electrode of the first sensor transistor PT1 through the sensor node NS. The first electrode of the second sensor transistor PT2 may be a drain electrode and the second electrode thereof may be a source electrode, but the configuration of the second sensor transistor PT2 is not limited thereto.

The third sensor transistor PT3 may be turned on in response to the first gate signal of the first gate line GWL to electrically connect the first electrode of the first sensor transistor PT1 to the read-out line ROL. The third sensor transistor PT3 may include a third-first sensor transistor PT3-1 and a third-second sensor transistor PT3-2 connected in series. The third-first sensor transistor PT3-1 and the third-second sensor transistor PT3-2 may be connected in series between the first electrode of the first sensor transistor PT1 and the read-out line ROL. The gate electrode of the third-first sensor transistor PT3-1 and the gate electrode of the third-second sensor transistor PT3-2 may be integrally formed and electrically connected to the first gate line GWL. The first electrode of the third-first sensor transistor PT3-1 may be connected to the read-out line ROL, and the second electrode of the third-second sensor transistor PT3-2 may be connected to the first electrode of the first sensor transistor PT1. The second electrode of the third-first sensor transistor PT3-1 and the first electrode of the third-second sensor transistor PT3-2 may be integrally formed. The first electrode of each of the third-first sensor transistor PT3-1 and the third-second sensor transistor PT3-2 may be a source electrode and the second electrode thereof may be a drain electrode, but the present disclosure is not limited thereto.

The light receiving element PD may recognize the pattern of the user's fingerprint based on light reflected from the user's finger. The first electrode of the light receiving element PD may be connected to the sensor node NS, which is connected to the gate electrode of the first sensor transistor PT1, and the second electrode thereof may be connected to the low potential line VSSL. The second electrode of the light receiving element PD may receive the low potential voltage from the low potential line VSSL. For example, the first electrode of the light receiving element PD may be a sensor electrode, and the second electrode thereof may be a common electrode, but the present disclosure is not limited thereto.

When the user's finger touches the display panel 100, the light receiving element PD may receive light reflected by the ridges and/or valleys of the finger. The light outputted from the light emitting element ED may be reflected by the ridges and/or valleys of the finger, and the reflected light may reach the light receiving element PD. The light receiving element PD may convert the energy of light into an electrical signal (current or voltage), and the converted electrical signal may flow from the sensor node NS to the low potential line VSSL. For example, when the light receiving element PD receives light and an electric field is formed between the first and second electrodes of the light receiving element PD, a current may flow through the light receiving element PD in proportion to the amount of light and the voltage at the sensor node NS may decrease. Accordingly, when the light receiving element PD receives light, the voltage of the sensor node NS may decrease and the magnitude of a sensing current (or source-drain current) of the first sensor transistor PT1 may increase. The sensing current of the first sensor transistor PT1 may be applied to the display driver 200 as a sensing signal through the third sensor transistor PT3 and the read-out line ROL.

Figure 9:
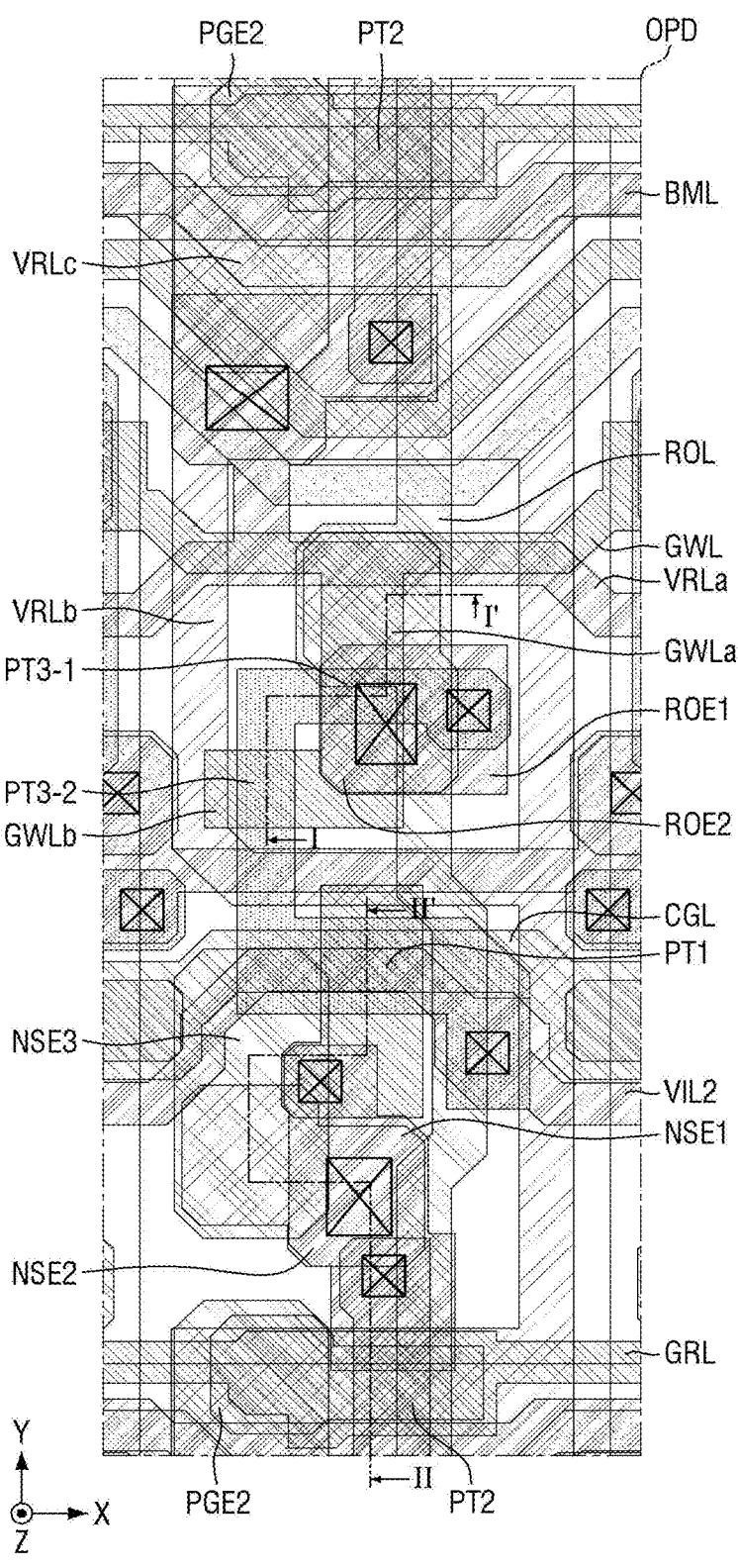
FIGS. 9, 10, 11, 12 and 13 are layout diagrams showing a fingerprint sensor of a display device according to one embodiment.
Figure 10:
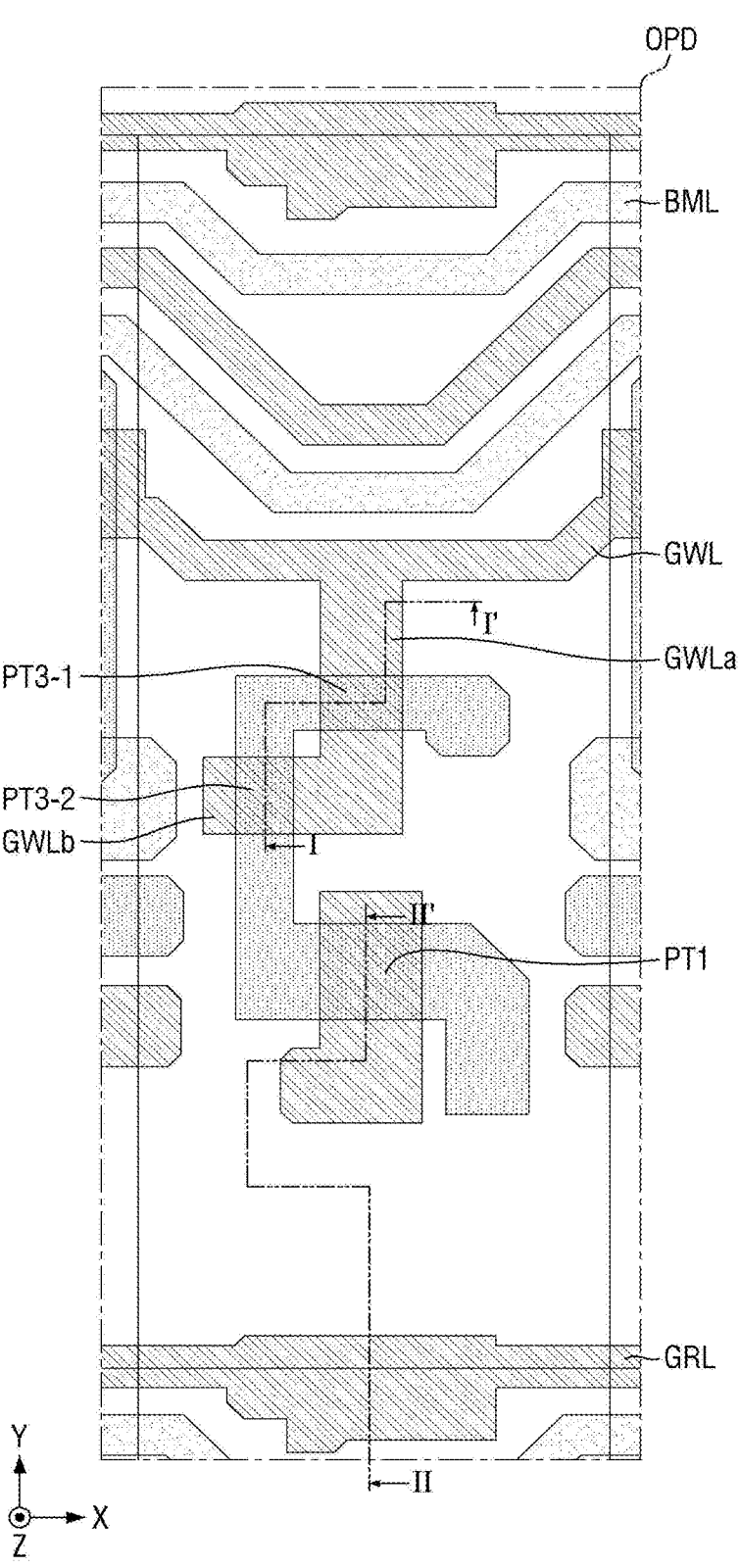
Figure 11:
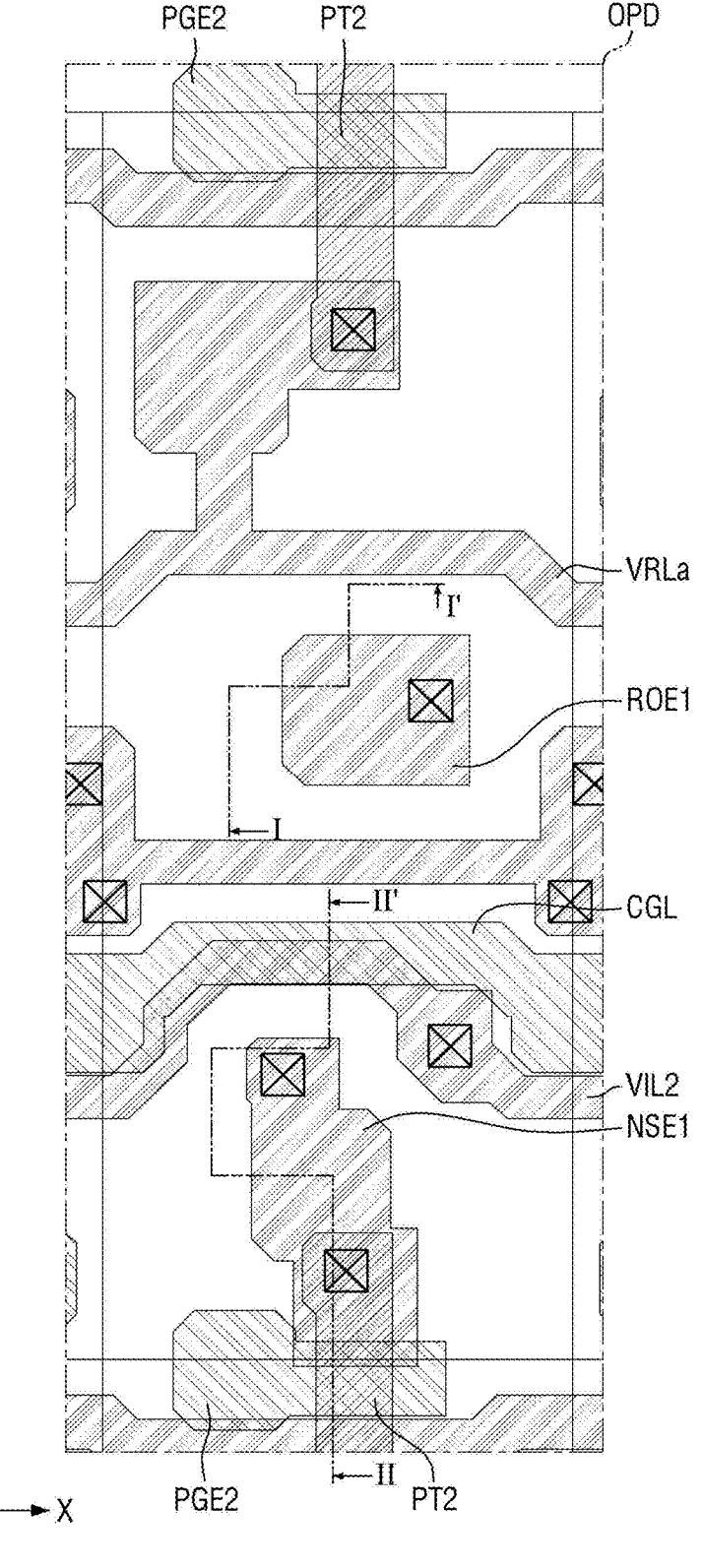
Figure 12:
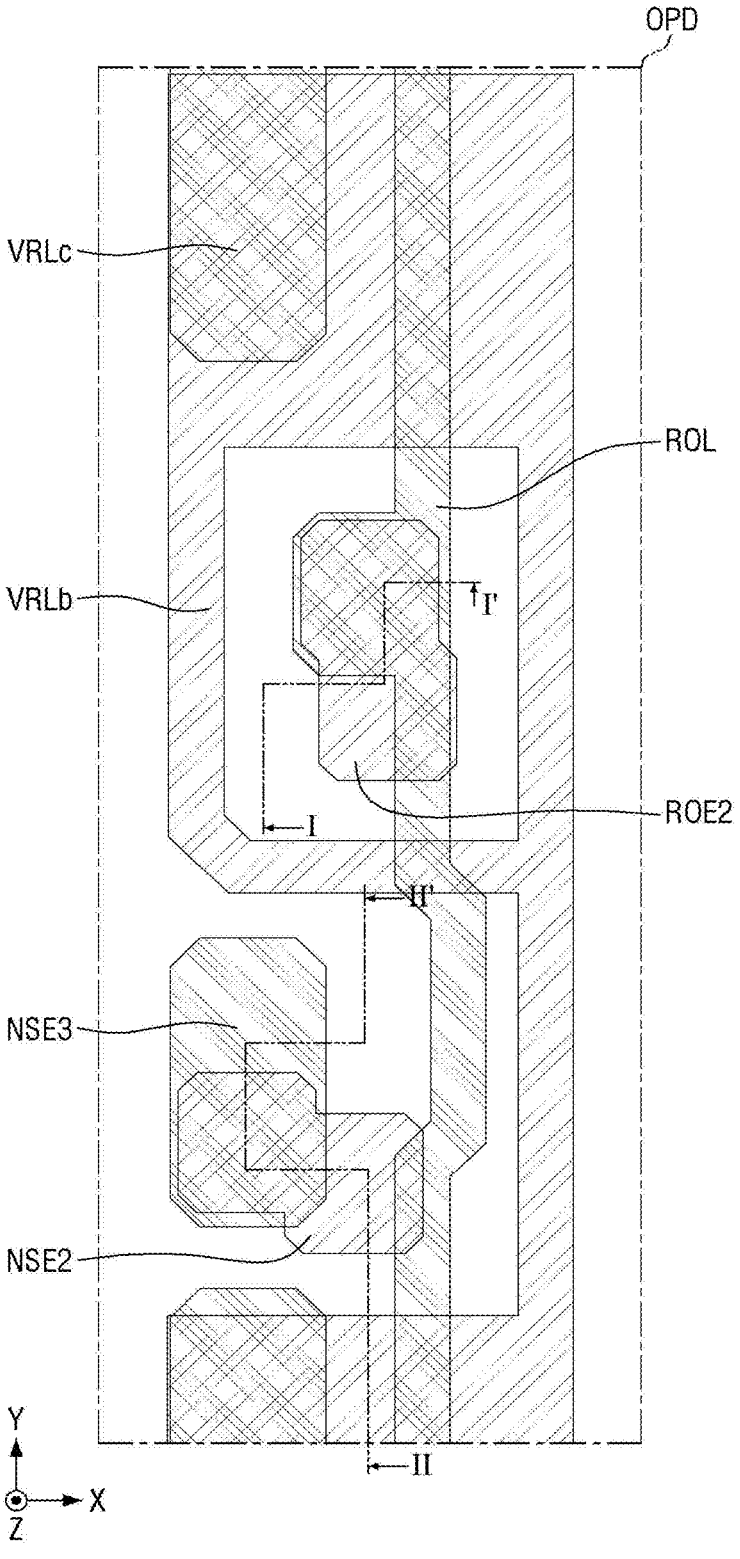
Figure 13:
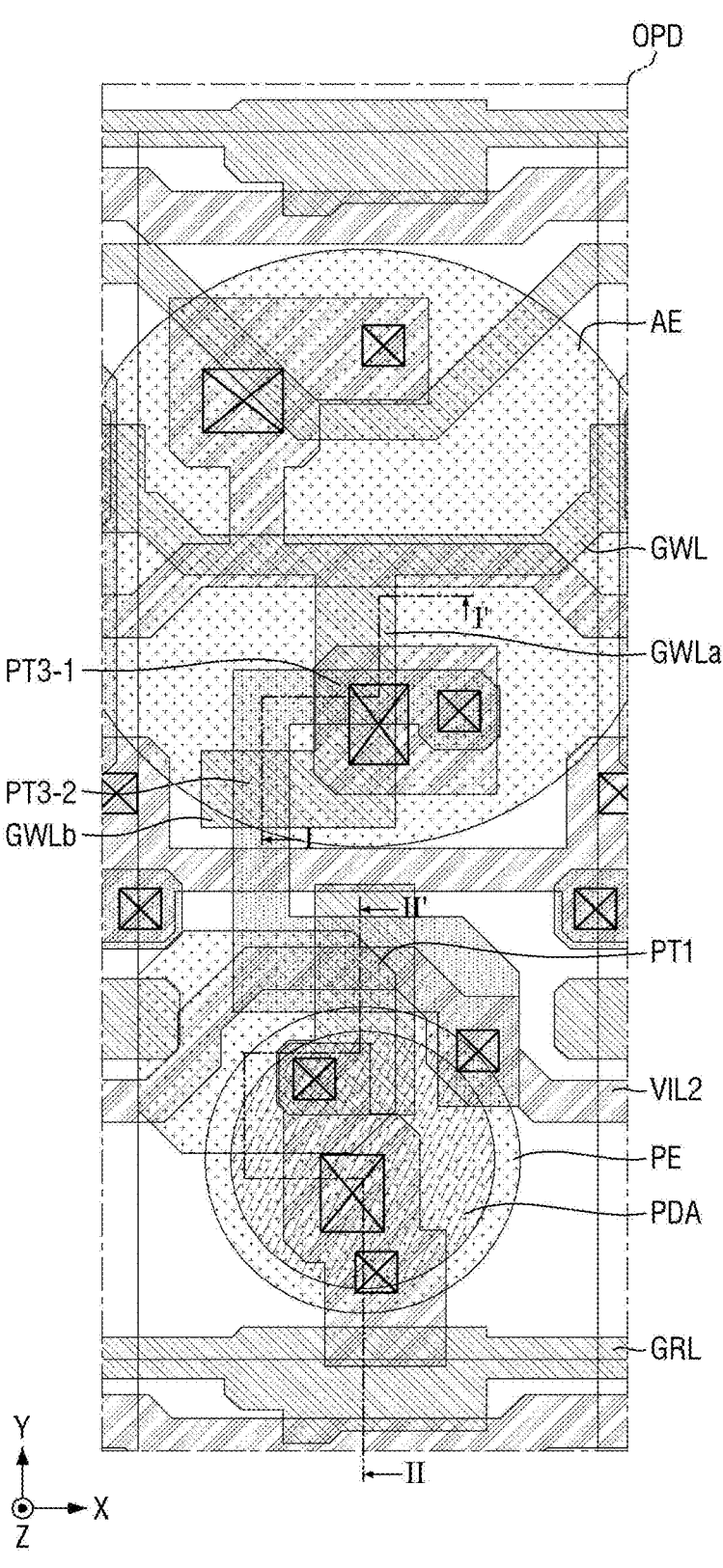
Figure 14:
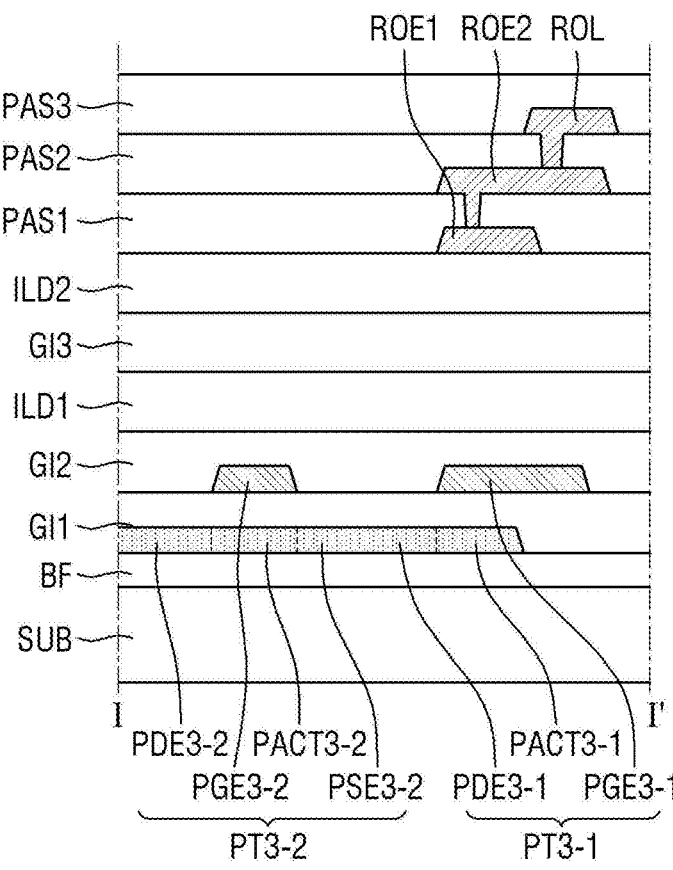
FIG. 14 is a cross-sectional view taken along line I-I' of FIGS. 9 to 13.
Figure 15:
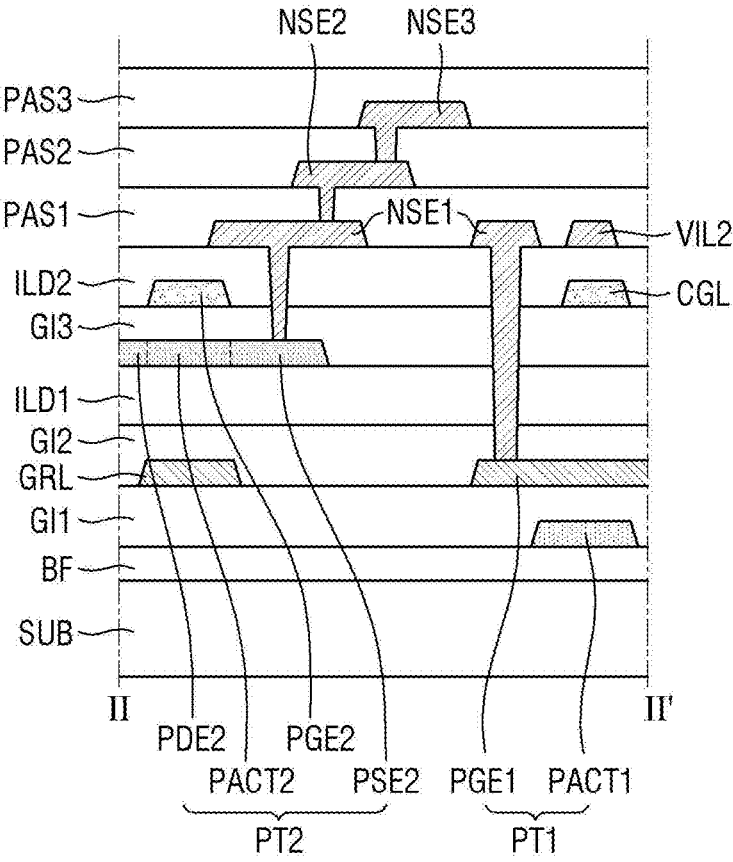
FIG. 15 is a cross-sectional view taken along line II-II' of FIGS. 9 to 13.

FIGS. 9 to 13 are layout diagrams showing a fingerprint sensor of a display device according to one embodiment. FIG. 9 is a layout diagram including a first active layer, a first gate layer, a second gate layer, a second active layer, a third gate layer, a first source metal layer, a second source metal layer, and a third source metal layer of a fingerprint sensor. FIG. 10 is a layout diagram including a first active layer, a first gate layer, and a second gate layer of a fingerprint sensor. FIG. 11 is a layout diagram including a second active layer, a third gate layer, and a first source metal layer of a fingerprint sensor. FIG. 12 is a layout diagram including a second source metal layer and a third source metal layer of a fingerprint sensor. FIG. 13 is a layout diagram including a first active layer, a first gate layer, a first source metal layer, and a sensor electrode of a fingerprint sensor and a pixel electrode of a pixel. FIG. 14 is a cross-sectional view taken along line I-I' of FIGS. 9 to 13, and FIG. 15 is a cross-sectional view taken along line II-II' of FIGS. 9 to 13.

Referring to FIGS. 9 to 15, the fingerprint sensor OPD may be connected to the first gate line GWL, the reset signal line GRL, the reset voltage line VRL, the second initialization voltage line VIL2, and the read-out line ROL.

The first gate line GWL may be disposed in the first gate layer GTL1 and extend in the X-axis direction. The first gate line GWL may supply a first gate signal to the third sensor transistor PT3 which includes the third-first sensor transistor PT3-1 and the third-second sensor transistor PT3-2.

The reset signal line GRL may be disposed in the first gate layer GTL1 and extend in the X-axis direction. The reset signal line GRL may be connected to a gate electrode PGE2 of the second sensor transistor PT2 disposed in the third gate layer GTL3. Thus, the reset signal line GRL may supply a reset signal to the gate electrode PGE2 of the second sensor transistor PT2.

The reset voltage line VRL may supply a reset voltage to a first electrode PDE2 of the second sensor transistor PT2. The reset voltage line VRL may include a first portion VRLa, a second portion VRLb, and a third portion VRLc.

The first portion VRLa of the reset voltage line VRL may be disposed in the first source metal layer SDL1 and extend in the X-axis direction. The first portion VRLa of the reset voltage line VRL may include a protrusion that protrudes in the Y-axis direction. The protrusion of the first portion VRLa of the reset voltage line VRL may be connected to the first electrode PDE2 of the second sensor transistor PT2 disposed in the second active layer ACTL2.

The second portion VRLb of the reset voltage line VRL may be disposed in the second source metal layer SDL2 and extend in the Y-axis direction. The second portion VRLb of the reset voltage line VRL may be connected between the first portion VRLa and the third portion VRLc of the reset voltage line VRL. The second portion VRLb of the reset voltage line VRL may surround a second read-out electrode ROE2 of the second source metal layer SDL2 while being spaced apart therefrom.

The third portion VRLc of the reset voltage line VRL may be disposed in the third source metal layer SDL3 and may be connected to the second portion VRLb of the reset voltage line VRL.

The second initialization voltage line VIL2 may be disposed in the first source metal layer SDL1 and extend in the X-axis direction. The second initialization voltage line VIL2 may be connected to the second electrode of the first sensor transistor PT1 disposed in the first active layer ACTL1. Thus, the second initialization voltage line VIL2 may supply a second initialization voltage to the second electrode of the first sensor transistor PT1.

A gate connection line CGL may be disposed in the third gate layer GTL3 and electrically connected to the first gate layer GTL1 that is spaced apart in the X-axis direction. The gate connection line CGL may overlap the first sensor transistor PT1. The light blocking layer BML may be disposed in the second gate layer GTL2 and extend in the X-axis direction.

The fingerprint sensor OPD may include the first to third sensor transistors PT1, PT2, and PT3 and the light receiving element PD.

The first sensor transistor PT1 may include a semiconductor region PACT1 and a gate electrode PGE1. The semiconductor region PACT1 of the first sensor transistor PT1 may be disposed in the first active layer ACTL1, and the gate electrode PGE1 of the first sensor transistor PT1 may be disposed in the first gate layer GTL1. The gate electrode PGE1 of the first sensor transistor PT1 may overlap the semiconductor region PACT1 of the first sensor transistor PT1. The semiconductor region PACT1 of the first sensor transistor PT1 may include a silicon-based material. For example, the semiconductor region PACT1 of the first sensor transistor PT1 may include low temperature polycrystalline silicon (LTPS).

The gate electrode PGE1 of the first sensor transistor PT1 may be electrically connected to the sensor electrode PE through first to third sensor node electrodes NSE1, NSE2, and NSE3. The first sensor node electrode NSE1 may be disposed in the first source metal layer SDL1 and connected to the gate electrode PGE1 of the first sensor transistor PT1. The second sensor node electrode NSE2 may be disposed in the second source metal layer SDL2 and connected to the first sensor node electrode NSE1. The third sensor node electrode NSE3 may be disposed in the third source metal layer SDL3 and electrically connect the second sensor node electrode NSE2 to the sensor electrode PE. The first to third sensor node electrodes NSE1, NSE2, and NSE3 may correspond to the sensor node NS of FIG. 8 and may be electrically connected to the sensor electrode PE of the light receiving element PD. The gate electrode PGE1 of the first sensor transistor PT1 may be electrically connected to a second electrode PSE2 of the second sensor transistor PT2 disposed in the second active layer ACTL2 through the first sensor node electrode NSE1. The sensor electrode PE of the light receiving element PD may be exposed through the fingerprint sensor area PDA.

The second sensor transistor PT2 may include a semiconductor region PACT2, the gate electrode PGE2, the first electrode PDE2, and the second electrode PSE2. The semiconductor region PACT2, the first electrode PDE2, and the second electrode PSE2 of the second sensor transistor PT2 may be portions of the second active layer ACTL2, and the gate electrode PGE2 of the second sensor transistor PT2 may be disposed in the third gate layer GTL3. The gate electrode PGE3 of the second sensor transistor PT2 may receive a reset signal from the reset signal line GRL of the first gate layer GTL1, and may overlap the semiconductor region PACT2 of the second sensor transistor PT2. For example, the semiconductor region PACT2 of the second sensor transistor PT2 may include an oxide-based material. The reset signal line GRL may be disposed in the first gate layer GTL1 and overlap the semiconductor region PACT2 of the second sensor transistor PT2. Thus, the reset signal line GRL may block light incident from the lower portion of the second sensor transistor PT2.

The third sensor transistor PT3 may include the third-first sensor transistor PT3-1 and the third-second sensor transistor PT3-2 connected in series. The third-first sensor transistor PT3-1 may include a semiconductor region PACT3-1, a gate electrode PGE3-1, a first electrode, and a second electrode PDE3-1. The semiconductor region PACT3-1, the first electrode, and the second electrode PDE3-1 of the third-first sensor transistor PT3-1 may be disposed in the first active layer ACTL1, and the gate electrode PGE3-1 thereof may be disposed in the first gate layer GTL1. The gate electrode PGE3-1 of the third-first sensor transistor PT3-1 may overlap the semiconductor region PACT3-1 of the third-first sensor transistor PT3-1. The semiconductor region PACT3-1 of the third-first sensor transistor PT3-1 may include low temperature polycrystalline silicon (LTPS). The gate electrode PGE3-1 of the third-first sensor transistor PT3-1 may be a portion of a first extension portion GWLa extending from the first gate line GWL in a direction opposite to the Y-axis.

The first electrode of the third-first sensor transistor PT3-1 may be electrically connected to the read-out line ROL of the third source metal layer SDL3 through the first read-out electrode ROE1 and the second read-out electrode ROE2. The first read-out electrode ROE1 may be disposed in the first source metal layer SDL1 and connected to the first electrode of the third-first sensor transistor PT3-1. The second read-out electrode ROE2 may be disposed in the second source metal layer SDL2 and electrically connect the first read-out electrode ROE1 to the read-out line ROL. The read-out line ROL may extend in the Y-axis direction and supply a sensing signal to the display driver 200.

The third-second sensor transistor PT3-2 may include a semiconductor region PACT3-2, a gate electrode PGE3-2, a first electrode PSE3-2, and a second electrode PDE3-2. The semiconductor region PACT3-2, the first electrode PSE3-2, and the second electrode PDE3-2 of the third-second sensor transistor PT3-2 may be disposed in the first active layer ACTL1, and the gate electrode PGE3-2 thereof may be disposed in the first gate layer GTL1. The gate electrode PGE3-2 of the third-second sensor transistor PT3-2 may overlap the semiconductor region PACT3-2 of the third-second sensor transistor PT3-2. The semiconductor region PACT3-2 of the third-second sensor transistor PT3-2 may include low temperature polycrystalline silicon (LTPS). The gate electrode PGE3-2 of the third-second sensor transistor PT3-2 may be a portion of a second extension portion GWLb extending from the first extension portion GWLa of the first gate line GWL in a direction opposite to the X-axis. The second electrode PDE3-2 of the third-second sensor transistor PT3-2 may be connected to the first electrode of the first sensor transistor PT1.

Figure 16:
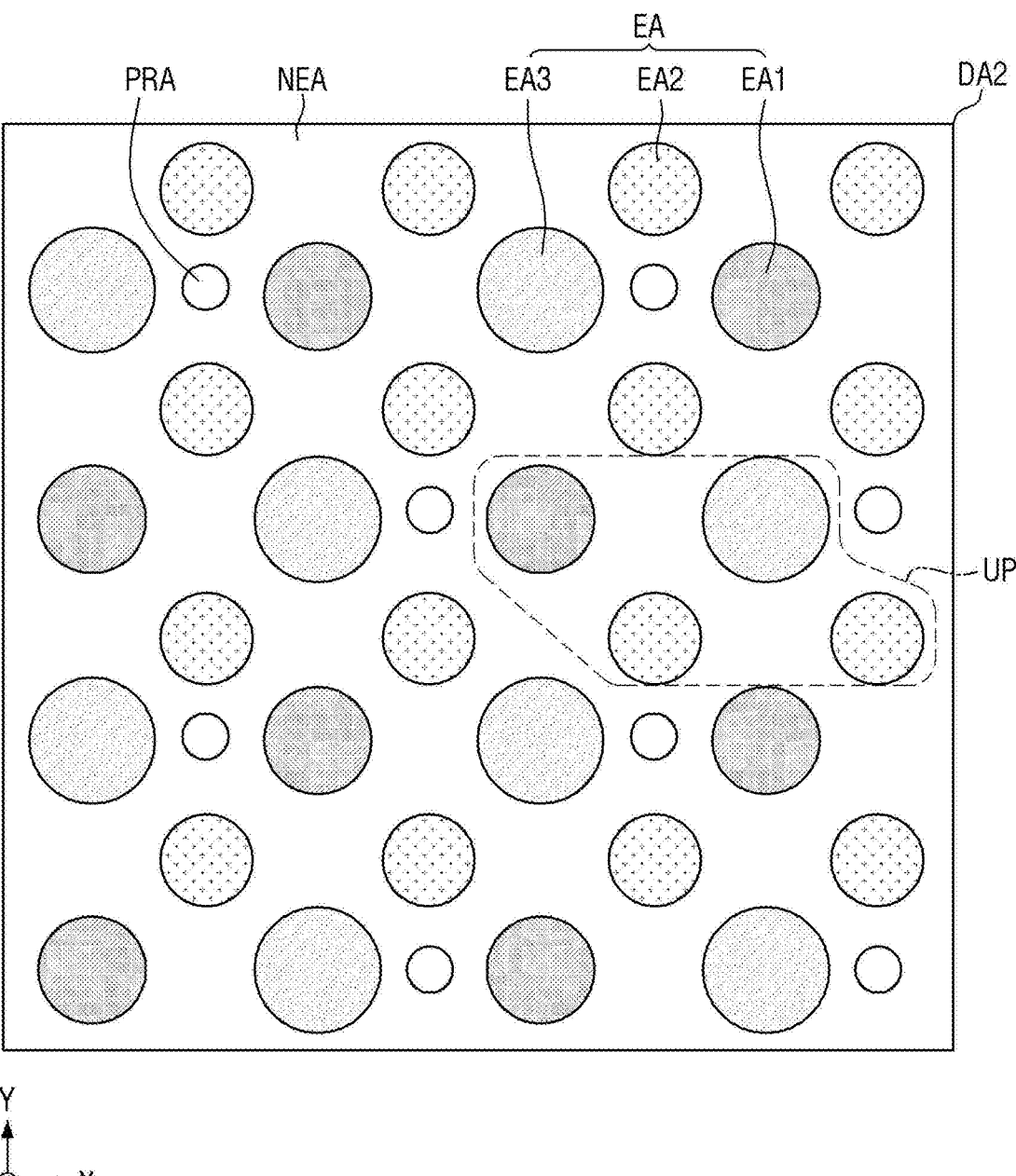
FIG. 16 is a plan view illustrating a second display area of a display device according to one embodiment.

FIG. 16 is a plan view illustrating a second display area of a display device according to one embodiment.

Referring to FIG. 16, the second display area DA2 may include emission areas EA and a non-emission area NEA which is a remaining portion of the second display area DA2 except the emission areas EA. The emission areas EA may emit light of the light emitting elements, and the light emitting elements may not be disposed in the non-emission area NEA. The non-emission area NEA may include illuminance sensor areas PRA spaced apart from each other with at least one emission area EA disposed therebetween. The emission areas EA may include first to third emission areas EA1, EA2, and EA3. For example, the first emission area EA1 may emit light of a first color or red light, the second emission area EA2 may emit light of a second color or green light, and the third emission area EA3 may emit light of a third color or blue light, but the configuration of the emission area EA is not limited thereto.

One unit pixel UP may include one first emission area EA1, two second emission areas EA2, and one third emission area EA3 to represent a white gray scale, but the configuration of the unit pixel UP is not limited thereto. The white gray scale may be represented by a combination of light emitted from one first emission area EA1, light emitted from two second emission areas EA2, and light emitted from one third emission area EA3.

The first to third emission areas EA1, EA2, and EA3 may be different in size from each other. For example, the size of the third emission area EA3 may be larger than that of the first emission area EA1, and the size of the first emission area EA1 may be larger than that of the second emission area EA2. However, the present disclosure is not limited thereto. As another example, the sizes of the first to third emission areas EA1, EA2, and EA3 may be the same.

The illuminance sensor area PRA may be surrounded by the first to third emission areas EA1, EA2, and EA3. The illuminance sensor area PRA may be disposed adjacent to the first or third emission area EA1 or EA3 in the X-axis direction, and may be disposed adjacent to the second emission area EA2 in the Y-axis direction. The illuminance sensor areas PRA may be spaced apart from each other with at least one emission area EA disposed therebetween. The illuminance sensor area PRA may receive external light.

The size of the illuminance sensor area PRA in FIG. 16 may be smaller than the size of the fingerprint sensor area PDA in FIG. 5. Since the illuminance sensor area PRA receives external light and the fingerprint sensor area PDA receives light reflected by a finger, the intensity of light incident on the illuminance sensor area PRA may be greater than the intensity of light incident on the fingerprint sensor area PDA. Accordingly, the size of the illuminance sensor area PRA may be smaller than the size of the fingerprint sensor area PDA.

Figure 17:
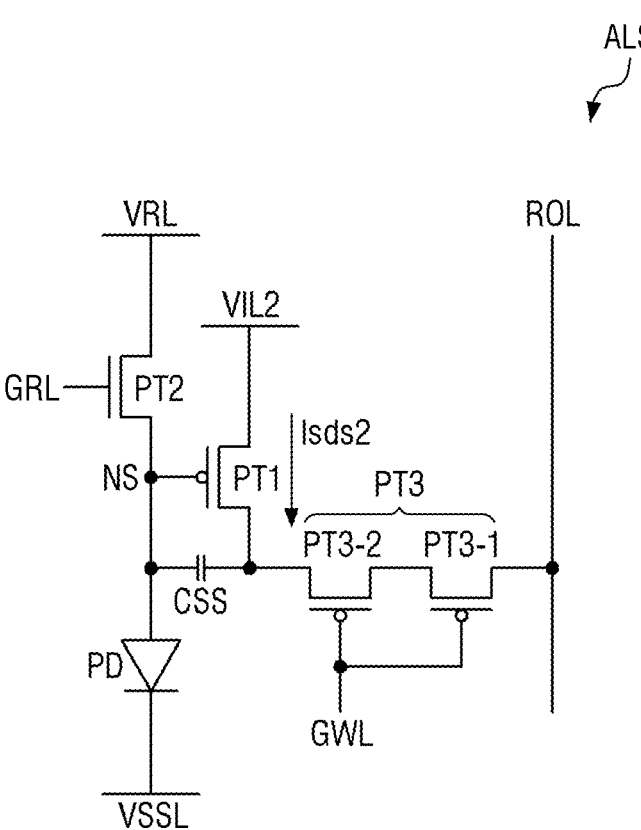
FIG. 17 is a circuit diagram of an illuminance sensor of a display device according to one embodiment.

FIG. 17 is a circuit diagram of an illuminance sensor of a display device according to one embodiment.

Referring to FIG. 17, the illuminance sensor ALS may be connected to the first gate line GWL, the reset signal line GRL, the reset voltage line VRL, the second initialization voltage line VIL2, and the read-out line ROL.

The illuminance sensor ALS may include a light receiving element PD and an illuminance sensor circuit for driving the light receiving element PD. The illuminance sensor circuit may include the first to third sensor transistors PT1, PT2, and PT3 and a sensor capacitor CSS.

The first sensor transistor PT1 may include a gate electrode, a first electrode, and a second electrode. The gate electrode of the first sensor transistor PT1 may be connected to the sensor node NS and the second capacitor electrode of the sensor capacitor CSS, the first electrode thereof may be connected to the third sensor transistor PT3 and the first capacitor electrode of the sensor capacitor CSS, and the second electrode thereof may be connected to the second initialization voltage line VIL2. The first sensor transistor PT1 may control the source-drain current Isds2 (hereinafter referred to as "sensing current") based on the voltage of the sensor node NS, which is the first electrode of the light receiving element PD. The sensing current Isds2 flowing through the channel of the first sensor transistor PT1 may be proportional to the square of a difference between the threshold voltage Vth and the voltage Vgs between the gate electrode and the source electrode of the first sensor transistor PT1 $(Isds2=k'\times(Vgs-Vth)^2)$. Here, k' is a proportional coefficient determined by the structure and physical characteristics of the first sensor transistor PT1, Vgs is a gate-source voltage of the first sensor transistor PT1, and Vth is a threshold voltage of the first sensor transistor PT1. The first electrode of the first sensor transistor PT1 may be a source electrode and the second electrode thereof may be a drain electrode, but the present disclosure is not limited thereto.

The second sensor transistor PT2 may be turned on in response the reset signal of the reset signal line GRL to supply a reset voltage to the sensor node NS. The gate electrode of the second sensor transistor PT2 may be connected to the reset signal line GRL, the first electrode thereof may be connected to the reset voltage line VRL, and the second electrode thereof may be connected to the sensor node NS. The second electrode of the second sensor transistor PT2 may be connected to the first electrode of the light receiving element PD, the gate electrode of the first sensor transistor PT1, and the second capacitor electrode of the sensor capacitor CSS through the sensor node NS. The first electrode of the second sensor transistor PT2 may be a drain electrode and the second electrode thereof may be a source electrode, but the configuration of the second sensor transistor PT2 is not limited thereto.

The third sensor transistor PT3 may be turned on in response to the first gate signal of the first gate line GWL to electrically connect the first electrode of the first sensor transistor PT1 to the read-out line ROL. The third sensor transistor PT3 may include the third-first sensor transistor PT3-1 and the third-second sensor transistor PT3-2 connected in series. The third-first sensor transistor PT3-1 and the third-second sensor transistor PT3-2 may be connected in series between the first electrode of the first sensor transistor PT1 and the read-out line ROL. The gate electrode of the third-first sensor transistor PT3-1 and the gate electrode of the third-second sensor transistor PT3-2 may be integrally formed and electrically connected to the first gate line GWL. The first electrode of the third-first sensor transistor PT3-1 may be connected to the read-out line ROL, and the second electrode of the third-second sensor transistor PT3-2 may be connected to the first electrode of the first sensor transistor PT1 and the first capacitor electrode of the sensor capacitor CSS. The second electrode of the third-first sensor transistor PT3-1 and the first electrode of the third-second sensor transistor PT3-2 may be integrally formed. The first electrode of each of the third-first sensor transistor PT3-1 and the third-second sensor transistor PT3-2 may be a source electrode and the second electrode thereof may be a drain electrode, but the present disclosure is not limited thereto.

The sensor capacitor CSS may be connected between the first electrode of the first sensor transistor PT1 and the gate electrode of the first sensor transistor PT1. For example, the first capacitor electrode of the sensor capacitor CSS may be connected to the first electrode of the first sensor transistor PT1, the second capacitor electrode of the sensor capacitor CSS may be connected to the sensor node NS, so that the potential difference between the first electrode of the light receiving element PD and the first electrode of the first sensor transistor PT1 may be maintained.

The light receiving element PD may sense external ling which is incident on the display panel 100. The first electrode of the light receiving element PD may be connected to the sensor node NS, which is the gate electrode of the first sensor transistor PT1, and the second electrode thereof may be connected to the low potential line VSSL. The second electrode of the light receiving element PD may receive the low potential voltage from the low potential line VSSL. For example, the first electrode of the light receiving element PD may be a sensor electrode, and the second electrode thereof may be a common electrode, but the present disclosure is not limited thereto.

When external light is incident on the display panel 100, the light receiving element PD may receive the external light. The light receiving element PD may convert the energy of light into an electrical signal (current or voltage) f, and the converted electrical signal may flow from the sensor node NS to the low potential line VSSL. For example, when the light receiving element PD receives light and an electric field is formed between the first and second electrodes of the light receiving element PD, a current may flow through the light receiving element PD in proportion to the amount of light and the voltage at the sensor node NS may decrease. Accordingly, when the light receiving element PD receives light, the voltage of the sensor node NS may decrease and the magnitude of a sensing current (or source-drain current) of the first sensor transistor PT1 may increase. The sensing current of the first sensor transistor PT1 may be applied to the display driver 200 as a sensing signal through the third sensor transistor PT3 and the read-out line ROL.

Figure 18:
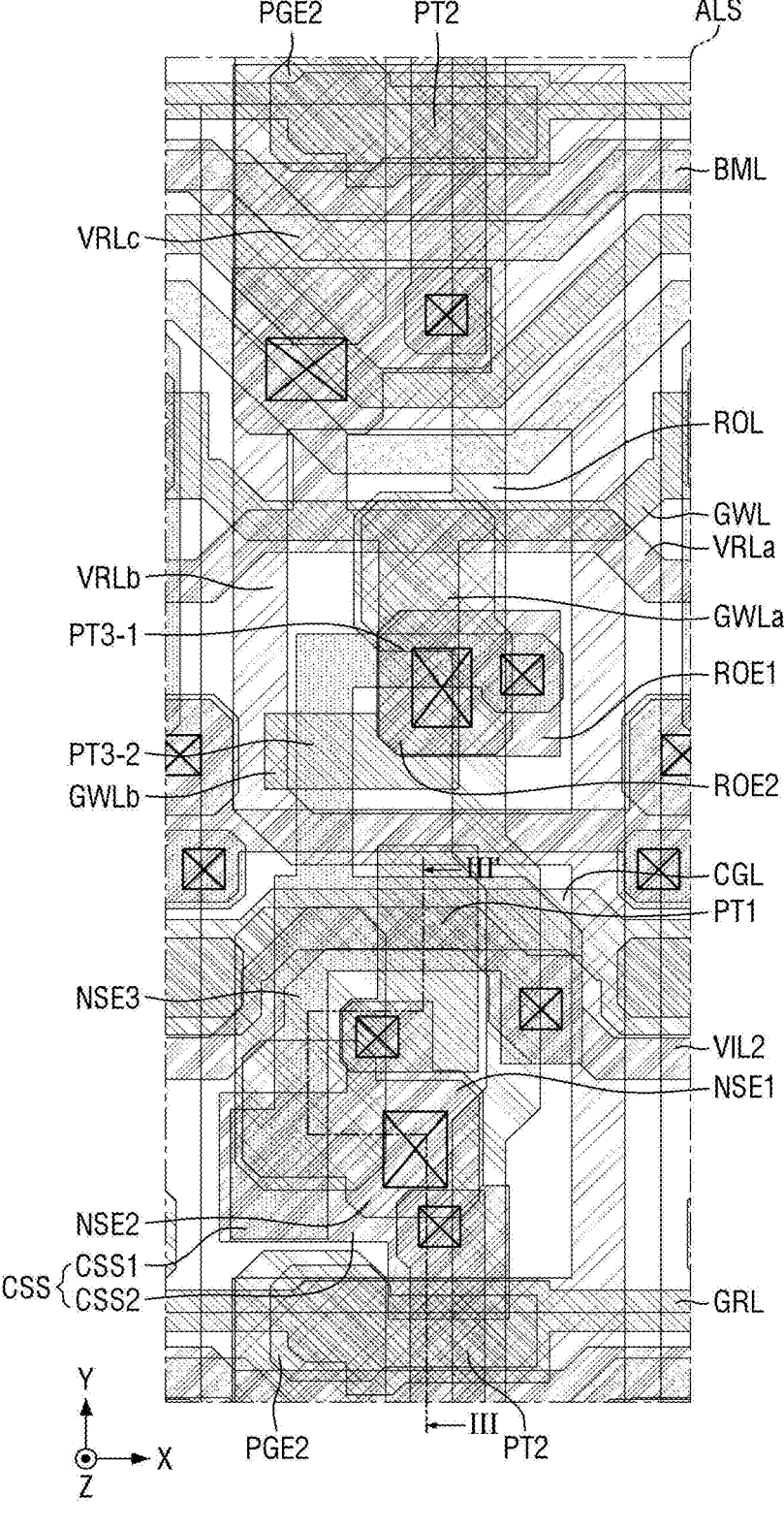
FIGS. 18, 19, 20, 21 and 22 are layout diagrams showing an illuminance sensor of a display device according to one embodiment.
Figure 19:
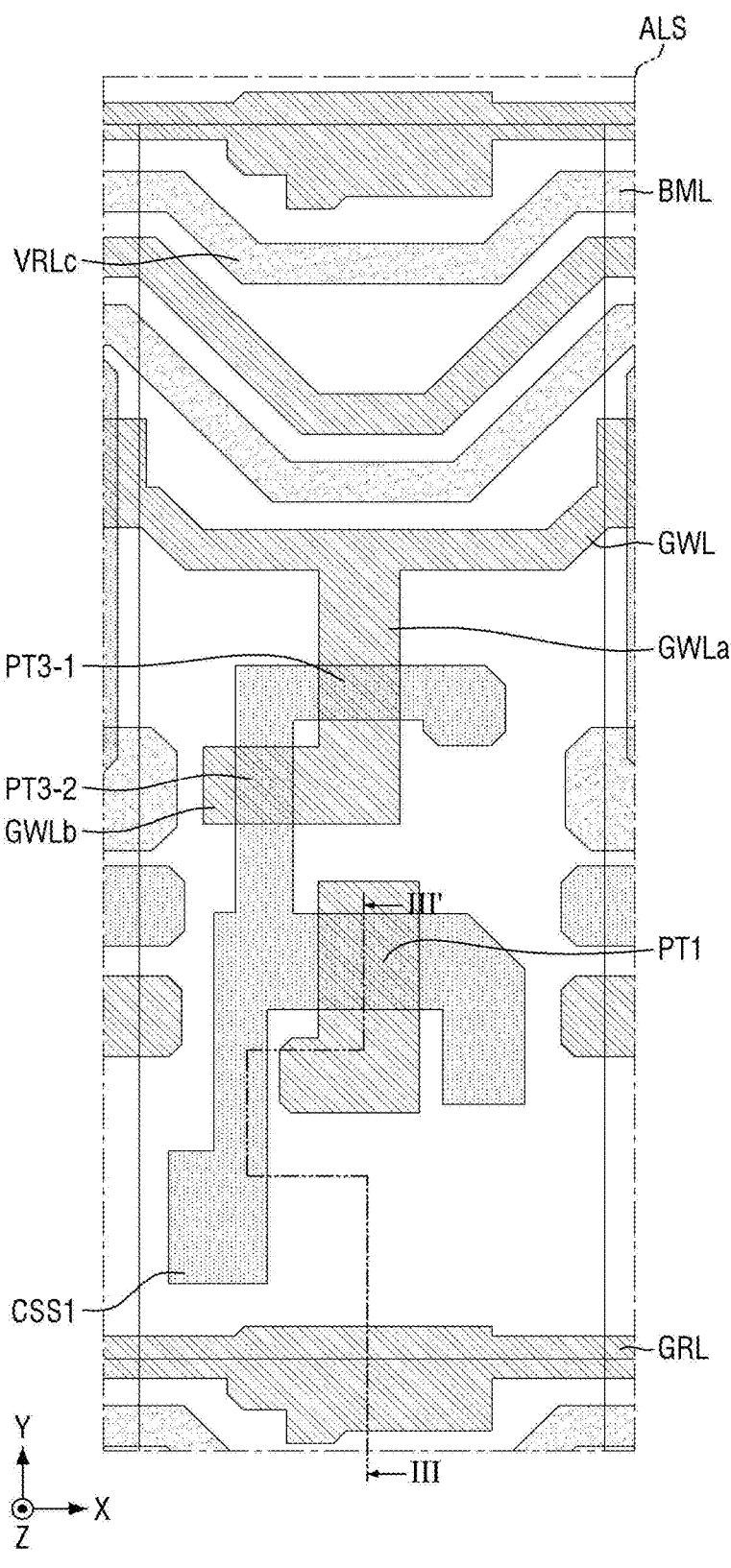
Figure 20:
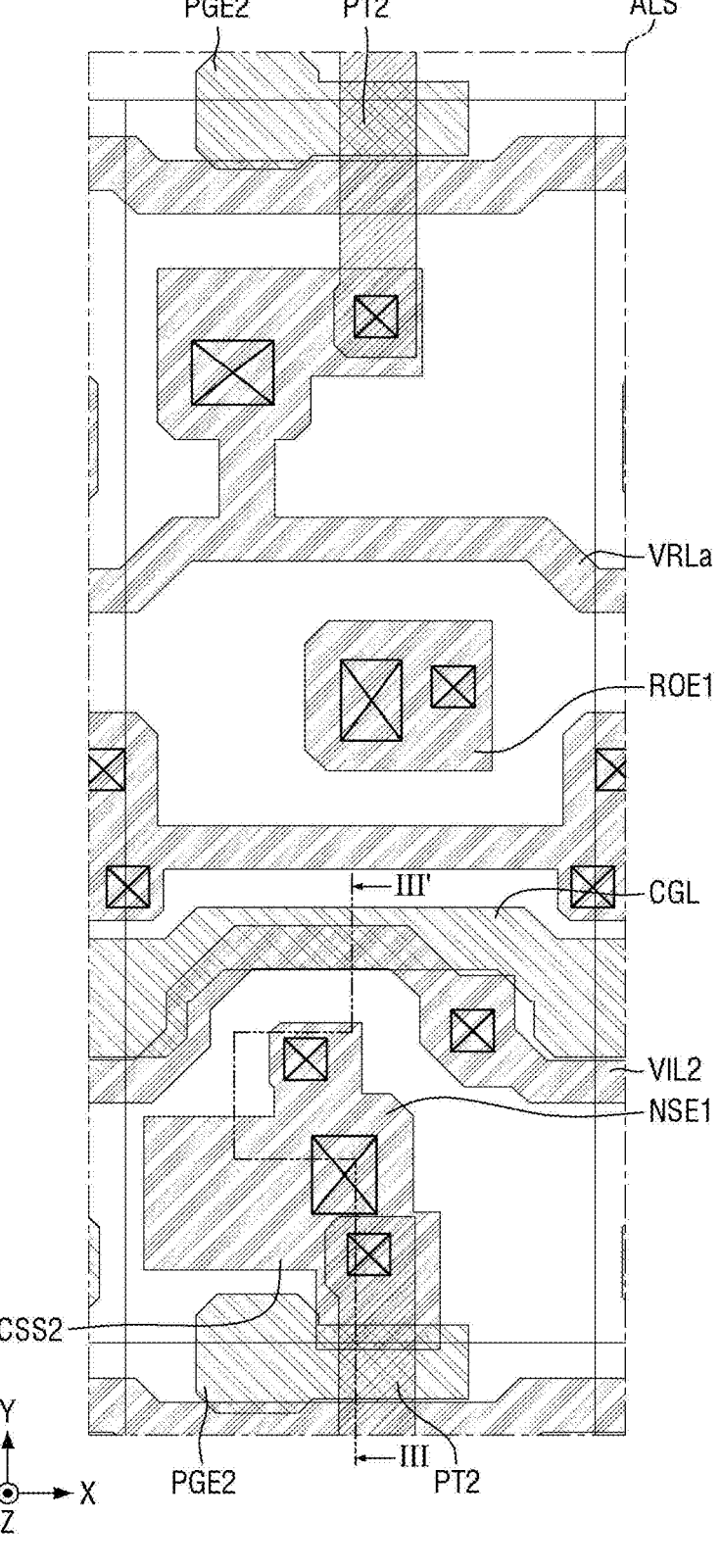
Figure 21:
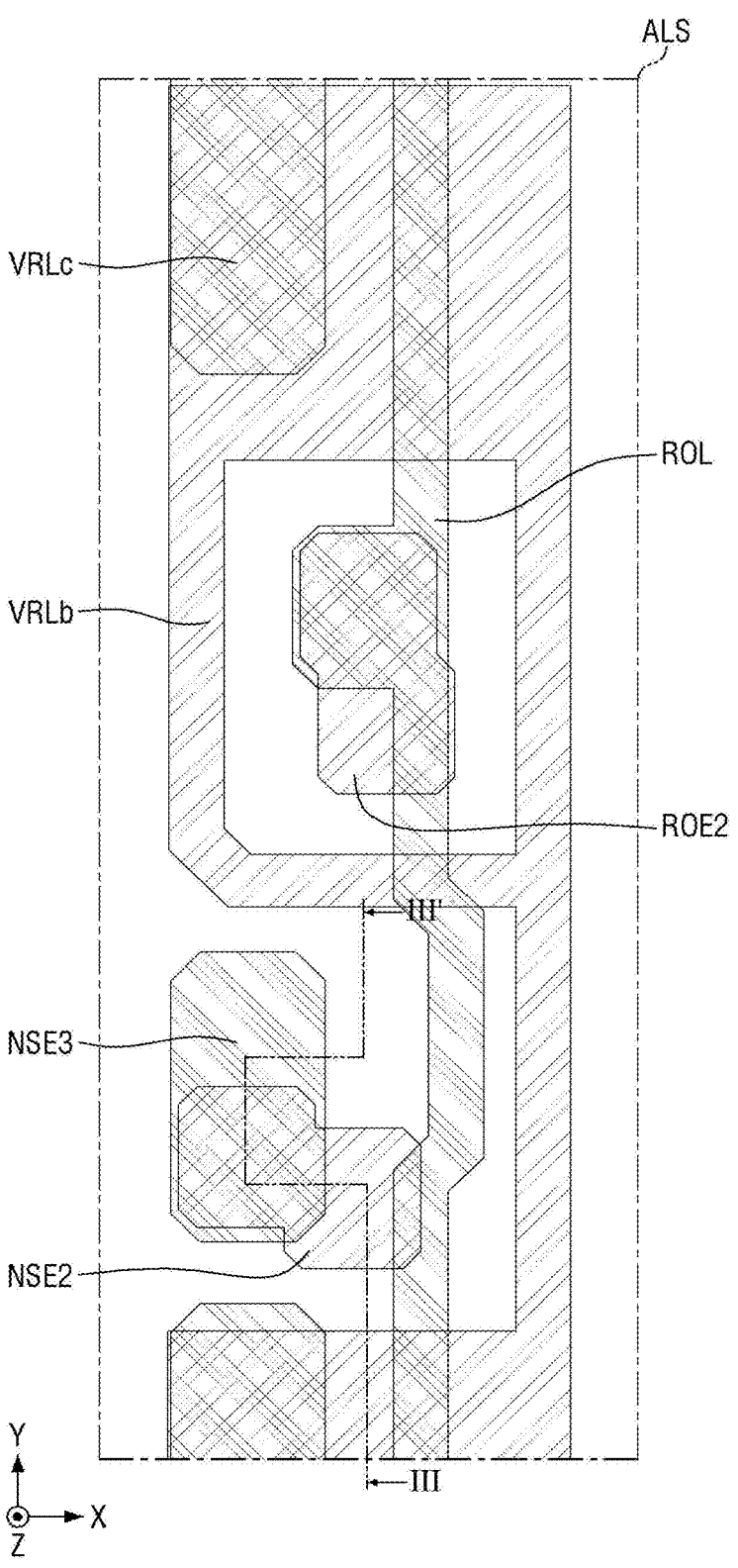
Figure 22:
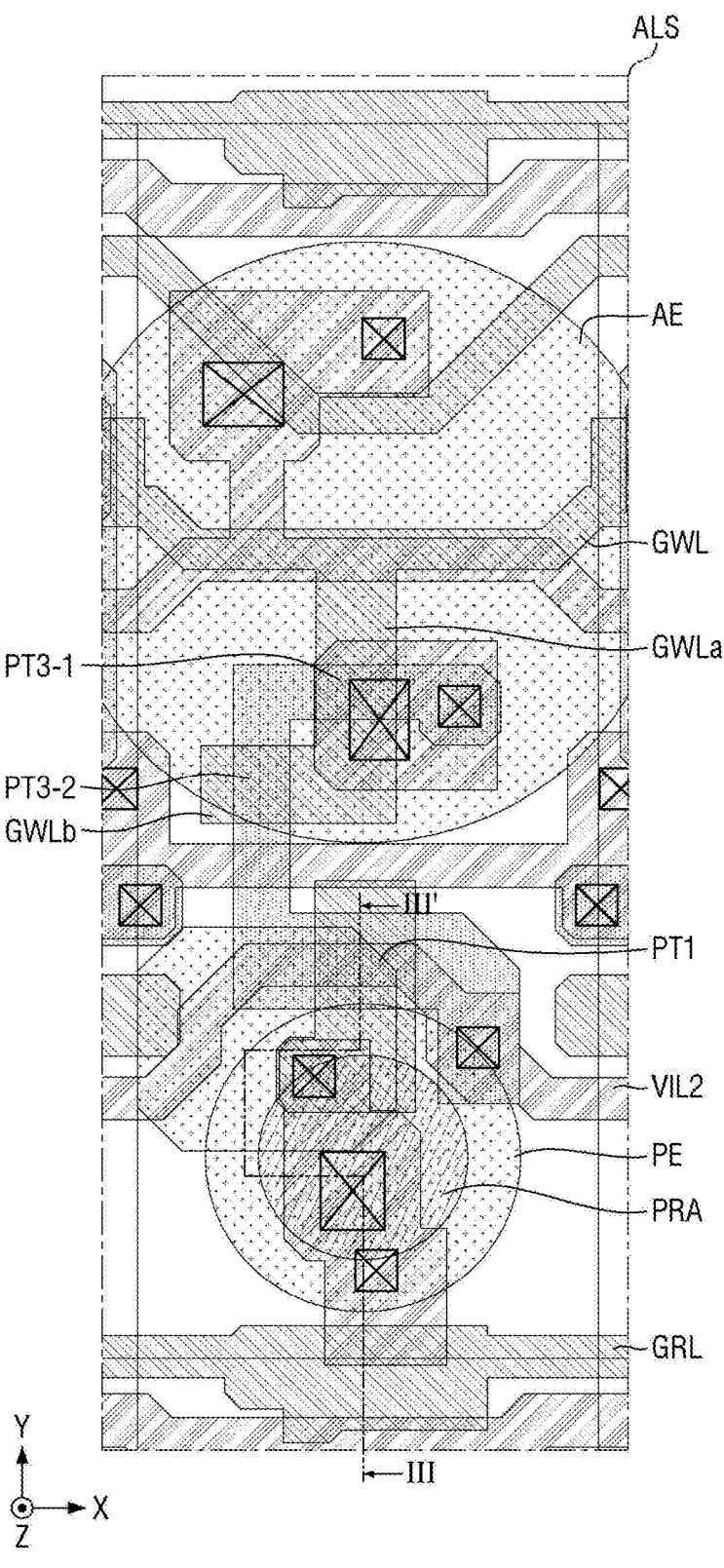
Figure 23:
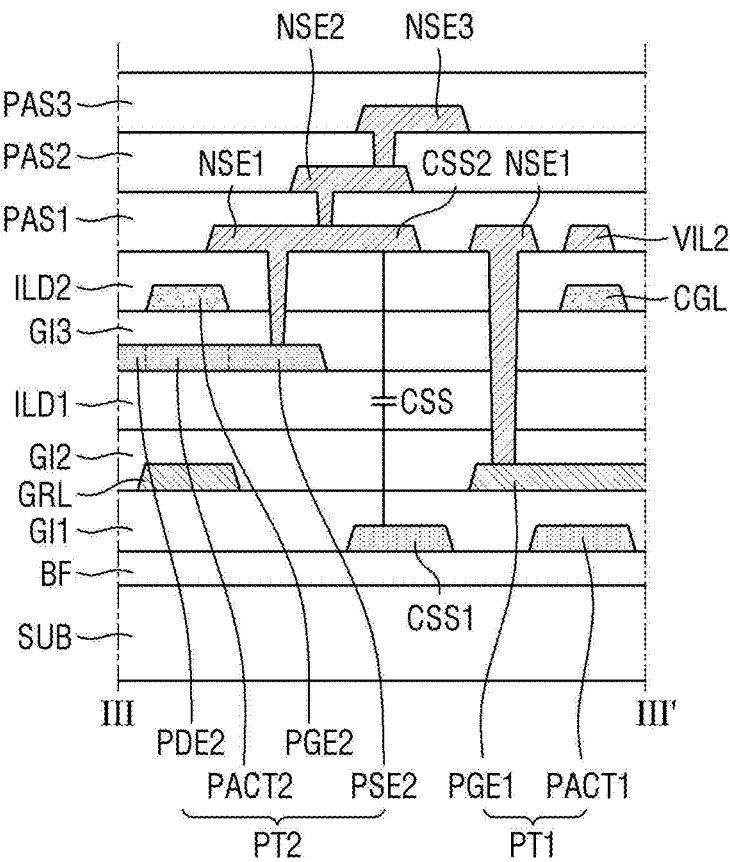
FIG. 23 is a cross-sectional view taken along line III-III' of FIGS. 18 to 22.

FIGS. 18 to 22 are layout diagrams showing an illuminance sensor of a display device according to one embodiment. FIG. 18 is a layout diagram including a first active layer, a first gate layer, a second gate layer, a second active layer, a third gate layer, a first source metal layer, a second source metal layer, and a third source metal layer of an illuminance sensor. FIG. 19 is a layout diagram including a first active layer, a first gate layer, and a second gate layer of an illuminance sensor. FIG. 20 is a layout diagram including a second active layer, a third gate layer, and a first source metal layer of an illuminance sensor. FIG. 21 is a layout diagram including a second source metal layer and a third source metal layer of an illuminance sensor. FIG. 22 is a layout diagram including a first active layer, a first gate layer, a first source metal layer, and a sensor electrode of an illuminance sensor and a pixel electrode of a pixel. FIG. 23 is a cross-sectional view taken along line III-III' of FIGS. 18 to 22.

Referring to FIGS. 18 to 23, the illuminance sensor ALS may be connected to the first gate line GWL, the reset signal line GRL, the reset voltage line VRL, the second initialization voltage line VIL2, and the read-out line ROL.

The first gate line GWL may be disposed in the first gate layer GTL1 and extend in the X-axis direction. The first gate line GWL may supply a first gate signal to the third sensor transistor PT3.

The reset signal line GRL may be disposed in the first gate layer GTL1 and extend in the X-axis direction. The reset signal line GRL may be connected to the gate electrode PGE2 of the second sensor transistor PT2 disposed in the third gate layer GTL3. Thus, the reset signal line GRL may supply a reset signal to the gate electrode PGE2 of the second sensor transistor PT2.

The reset voltage line VRL may supply a reset voltage to the first electrode PDE2 of the second sensor transistor PT2. The reset voltage line VRL may include the first portion VRLa, the second portion VRLb, and the third portion VRLc.

The first portion VRLa of the reset voltage line VRL may be disposed in the first source metal layer SDL1 and extend in the X-axis direction. The first portion VRLa of the reset voltage line VRL may include a protrusion that protrudes in the Y-axis direction. The protrusion of the first portion VRLa of the reset voltage line VRL may be connected to the first electrode PDE2 of the second sensor transistor PT2 disposed in the second active layer ACTL2.

The second portion VRLb of the reset voltage line VRL may be disposed in the second source metal layer SDL2 and extend in the Y-axis direction. The second portion VRLb of the reset voltage line VRL may be connected between the first portion VRLa and the third portion VRLc of the reset voltage line VRL. The second portion VRLb of the reset voltage line VRL may surround the second read-out electrode ROE2 of the second source metal layer SDL2 while being spaced apart therefrom.

The third portion VRLc of the reset voltage line VRL may be disposed in the third source metal layer SDL3 and may be connected to the second portion VRLb of the reset voltage line VRL.

The second initialization voltage line VIL2 may be disposed in the first source metal layer SDL1 and extend in the X-axis direction. The second initialization voltage line VIL2 may be connected to the second electrode of the first sensor transistor PT1 disposed in the first active layer ACTL1. Thus, the second initialization voltage line VIL2 may supply a second initialization voltage to the second electrode of the first sensor transistor PT1.

The gate connection line CGL may be disposed in the third gate layer GTL3 and electrically connected to the first gate layer GTL1 that is spaced apart in the X-axis direction. The gate connection line CGL may overlap the first sensor transistor PT1. The light blocking layer BML may be disposed in the second gate layer GTL2 and extend in the X-axis direction.

The illuminance sensor ALS may include the first to third sensor transistors PT1, PT2, and PT3, the sensor capacitor CSS, and the light receiving element PD.

The first sensor transistor PT1 may include the semiconductor region PACT1 and the gate electrode PGE1. The semiconductor region PACT1 of the first sensor transistor PT1 may be disposed in the first active layer ACTL1, and the gate electrode PGE1 of the first sensor transistor PT1 may be disposed in the first gate layer GTL1. The gate electrode PGE1 of the first sensor transistor PT1 may overlap the semiconductor region PACT1 of the first sensor transistor PT1. The semiconductor region PACT1 of the first sensor transistor PT1 may include a silicon-based material. For example, the semiconductor region PACT1 of the first sensor transistor PT1 may include low temperature polycrystalline silicon (LTPS).

The gate electrode PGE1 of the first sensor transistor PT1 may be electrically connected to the sensor electrode PE through first to third sensor node electrodes NSE1, NSE2, and NSE3. The first sensor node electrode NSE1 may be disposed in the first source metal layer SDL1 and connected to the gate electrode PGE1 of the first sensor transistor PT1. The second sensor node electrode NSE2 may be disposed in the second source metal layer SDL2 and connected to the first sensor node electrode NSE1. The third sensor node electrode NSE3 may be disposed in the third source metal layer SDL3 and electrically connect the second sensor node electrode NSE2 to the sensor electrode PE. The first to third sensor node electrodes NSE1, NSE2, and NSE3 may correspond to the sensor node NS of FIG. 7 and may be electrically connected to the sensor electrode PE of the light receiving element PD. The gate electrode PGE1 of the first sensor transistor PT1 may be electrically connected to the second electrode PSE2 of the second sensor transistor PT2 disposed in the second active layer ACTL2 through the first sensor node electrode NSE1. The sensor electrode PE of the light receiving element PD may be exposed through the illuminance sensor area PRA.

The second sensor transistor PT2 may include the semiconductor region PACT2, the gate electrode PGE2, the first electrode PDE2, and the second electrode PSE2. The semiconductor region PACT2, the first electrode PDE2, and the second electrode PSE2 of the second sensor transistor PT2 may be disposed in the second active layer ACTL2, and the gate electrode PGE2 of the second sensor transistor PT2 may be disposed in the third gate layer GTL3. The gate electrode PGE3 of the second sensor transistor PT2 may receive a reset signal from the reset signal line GRL of the first gate layer GTL1, and may overlap the semiconductor region PACT2 of the second sensor transistor PT2. For example, the semiconductor region PACT2 of the second sensor transistor PT2 may include an oxide-based material. The reset signal line GRL may be disposed in the first gate layer GTL1 and overlap the semiconductor region PACT2 of the second sensor transistor PT2. Thus, the reset signal line GRL may block light incident from the lower portion of the second sensor transistor PT2.

The third sensor transistor PT3 may include the third-first sensor transistor PT3-1 and the third-second sensor transistor PT3-2 connected in series. The third-first sensor transistor PT3-1 may include a semiconductor region, a gate electrode, a first electrode, and a second electrode. The semiconductor region, the first electrode, and the second electrode of the third-first sensor transistor PT3-1 may be disposed in the first active layer ACTL1, and the gate electrode thereof may be disposed in the first gate layer GTL1. The gate electrode of the third-first sensor transistor PT3-1 may overlap the semiconductor region of the third-first sensor transistor PT3-1. The semiconductor region of the third-first sensor transistor PT3-1 may include low temperature polycrystalline silicon (LTPS). The gate electrode of the third-first sensor transistor PT3-1 may be a portion of a first extension portion GWLa extending from the first gate line GWL in a direction opposite to the Y-axis.

The first electrode of the third-first sensor transistor PT3-1 may be electrically connected to the read-out line ROL of the third source metal layer SDL3 through the first read-out electrode ROE1 and the second read-out electrode ROE2. The first read-out electrode ROE1 may be disposed in the first source metal layer SDL1 and connected to the first electrode of the third-first sensor transistor PT3-1. The second read-out electrode ROE2 may be disposed in the second source metal layer SDL2 and electrically connect the first read-out electrode ROE1 to the read-out line ROL. The read-out line ROL may extend in the Y-axis direction and supply a sensing signal to the display driver 200.

The third-second sensor transistor PT3-2 may include a semiconductor region, a gate electrode, a first electrode, and a second electrode. The semiconductor region, the first electrode, and the second electrode of the third-second sensor transistor PT3-2 may be disposed in the first active layer ACTL1, and the gate electrode thereof may be disposed in the first gate layer GTL1. The gate electrode of the third-second sensor transistor PT3-2 may overlap the semiconductor region of the third-second sensor transistor PT3-2. The semiconductor region of the third-second sensor transistor PT3-2 may include low temperature polycrystalline silicon (LTPS). The gate electrode of the third-second sensor transistor PT3-2 may be a portion of a second extension portion GWLb extending from the first extension portion GWLa of the first gate line GWL in a direction opposite to the X-axis. The second electrode of the third-second sensor transistor PT3-2 may be connected to the first electrode of the first sensor transistor PT1.

The sensor capacitor CSS may include a first capacitor electrode CSS1 and a second capacitor electrode CSS2. The first capacitor electrode CSS1 may be disposed in the first active layer ACTL1 and may be formed integrally with the first electrode of the first sensor transistor PT1 and the second electrode of the third-second sensor transistor PT3-2. The first capacitor electrode CSS1 may extend in a direction opposite to the Y-axis from the first electrode of the first sensor transistor PT1 or the second electrode of the third-second sensor transistor PT3-2.

The second capacitor electrode CSS2 may be disposed in the first source metal layer SDL1 and overlap the first capacitor electrode CSS1 in a plan view. The second capacitor electrode CSS2 may be formed integrally with the first sensor node electrode NSE1 and may be electrically connected to the gate electrode PGE1 of the first sensor transistor PT1. The second capacitor electrode CSS2 may be connected to the sensor electrode PE of the light receiving element PD through the second sensor node electrode NSE2 of the second source metal layer SDL2 and the third sensor node electrode NSE3 of the third source metal layer SDL3.

Accordingly, the sensor capacitor CSS may be connected between the first electrode of the first sensor transistor PT1 and the gate electrode PGE1 of the first sensor transistor PT1. Since the sensor capacitor CSS maintains the potential difference between the first electrode of the light receiving element PD and the first electrode of the first sensor transistor PT1, it is possible to prevent discharge of the light receiving element PD when a large amount of light is incident on the illuminance sensor area PRA, thereby improving the sensitivity of the illuminance sensor ALS.

The size of the illuminance sensor area PRA in FIG. 22 may be smaller than the size of the fingerprint sensor area PDA in FIG. 13. Since the illuminance sensor area PRA receives external light and the fingerprint sensor area PDA receives light reflected by a finger, the intensity of light incident on the illuminance sensor area PRA may be greater than the intensity of light incident on the fingerprint sensor area PDA. Accordingly, the size of the illuminance sensor area PRA may be smaller than the size of the fingerprint sensor area PDA.

The light emitting element ED of the pixel SP, the light receiving element PD of the fingerprint sensor OPD, and the light receiving element PD of the illuminance sensor ALS may be disposed in the same layer. The display device includes the fingerprint sensor OPD disposed in the first display area DA1 and the illuminance sensor ALS disposed in the second display area DA2, thereby utilizing both the fingerprint sensor OPD and the illuminance sensor ALS simultaneously.

The current disclosure should not be construed as being limited to the embodiments set forth herein. Rather, these embodiments are provided so that this disclosure will be thorough and complete and will fully convey the concept of the present disclosure to those skilled in the art.

While the current disclosure have been particularly shown and described with reference to some embodiments thereof, it will be understood by one of ordinary skill in the art that various changes in form and detail may be made therein without departing from the spirit and scope of the current disclosure as defined by the following claims.

What is claimed is:

1. An illuminance sensor comprising:
a read-out line disposed on a substrate and extending in a first direction;
a light receiving element disposed on the read-out line;
a first sensor transistor configured to control a sensing current based on a voltage of a sensor node, which is a first electrode of the light receiving element;
a second sensor transistor configured to supply a reset voltage to the sensor node in response to a reset signal;
a third sensor transistor configured to electrically connect a first electrode of the first sensor transistor to the read-out line in response to a gate signal; and
a sensor capacitor comprising a first capacitor electrode electrically connected to the first electrode of the first sensor transistor and a second capacitor electrode overlapping the first capacitor electrode and electrically connected to the first electrode of the light receiving element.

2. The illuminance sensor of claim 1, wherein the first capacitor electrode is formed integrally with the first electrode of the first sensor transistor.

3. The illuminance sensor of claim 1, wherein the third sensor transistor comprises a third-first sensor transistor and a third-second sensor transistor connected in series between the read-out line and the first electrode of the first sensor transistor.

4. The illuminance sensor of claim 3, wherein the first capacitor electrode is formed integrally with a drain electrode of the third-second sensor transistor.

5. The illuminance sensor of claim 3, further comprising:
a first read-out electrode disposed in the same layer as the second capacitor electrode and connected to a first electrode of the third-first sensor transistor; and a second read-out electrode disposed on the first read-out electrode and electrically connecting the first read-out electrode to the read-out line.

6. The illuminance sensor of claim 1, further comprising a first sensor node electrode formed integrally with the second capacitor electrode and electrically connected to a gate electrode of the first sensor transistor.

7. The illuminance sensor of claim 6, further comprising:
a second sensor node electrode disposed on the first sensor node electrode and connected to the first sensor node electrode; and
a third sensor node electrode disposed on the second sensor node electrode and electrically connecting the second sensor node electrode to the first electrode of the light receiving element.

8. The illuminance sensor of claim 1, wherein a semiconductor region of each of the first sensor transistor and the third sensor transistor includes a silicon-based material, and a semiconductor region of the second sensor transistor includes an oxide-based material.

9. The illuminance sensor of claim 1, further comprising:
a first active layer disposed on the substrate and comprising a semiconductor region of each of the first sensor transistor and the third sensor transistor;
a first gate layer disposed on the first active layer;
a second gate layer disposed on the first gate layer;
a second active layer disposed on the second gate layer and comprising a semiconductor region of the second sensor transistor;
a third gate layer disposed on the second active layer;
a first source metal layer disposed on the third gate layer;
a second source metal layer disposed on the first source metal layer; and
a third source metal layer disposed on the second source metal layer and comprising the read-out line.

10. The illuminance sensor of claim 9, wherein the first capacitor electrode is disposed in the first active layer, and the second capacitor electrode is disposed in the first source metal layer.

11. A display device comprising:
a first display area comprising a pixel comprising a light emitting element and a fingerprint sensor which receives light incident on a fingerprint sensor area to recognize a pattern of a user's fingerprint; and
a second display area disposed adjacent to the first display area and comprising an illuminance sensor which receives light incident on an illuminance sensor area to measure surrounding brightness,
wherein each of the fingerprint sensor and the illuminance sensor comprises:
a read-out line disposed on a substrate and extending in a first direction;
a light receiving element disposed on the read-out line;
a first sensor transistor configured to control a sensing current based on a voltage of a sensor node which is connected to the light receiving element;
a second sensor transistor configured to supply a reset voltage to the sensor node in response to a reset signal; and
a third sensor transistor configured to electrically connect a first electrode of the first sensor transistor to the read-out line in response to a gate signal, and
wherein the illuminance sensor further comprises a sensor capacitor comprising a first capacitor electrode electrically connected to the first electrode of the first sensor transistor and a second capacitor electrode overlapping the first capacitor electrode and electrically connected to the first electrode of the light receiving element.

12. The display device of claim 11, wherein the light emitting element of the pixel, the light receiving element of the fingerprint sensor, and the light receiving element of the illuminance sensor are disposed in the same layer.

13. The display device of claim 11, wherein a size of the illuminance sensor area is smaller than a size of the fingerprint sensor area.

14. The display device of claim 11, wherein a light receiving layer of the illuminance sensor receives light having a wavelength band wider than that of a light receiving layer of the fingerprint sensor.

15. The display device of claim 11, wherein the first capacitor electrode is formed integrally with the first electrode of the first sensor transistor of the illuminance sensor.

16. The display device of claim 11, wherein the third sensor transistor comprises a third-first sensor transistor and a third-second sensor transistor connected in series between the read-out line and the first electrode of the first sensor transistor, and wherein the first capacitor electrode is formed integrally with a drain electrode of the third-second sensor transistor of the illuminance sensor.

17. The display device of claim 16, wherein the illuminance sensor further comprises:

a first read-out electrode disposed in the same layer as the second capacitor electrode and connected to a first electrode of the third-first sensor transistor; and a second read-out electrode disposed on the first read-out electrode and electrically connecting the first read-out electrode to the read-out line.

18. The display device of claim 11, wherein the illuminance sensor further comprises a first sensor node electrode formed integrally with the second capacitor electrode and electrically connected to a gate electrode of the first sensor transistor.

19. The display device of claim 18, wherein the illuminance sensor further comprises:

a second sensor node electrode disposed on the first sensor node electrode and connected to the first sensor node electrode; and a third sensor node electrode disposed on the second sensor node electrode and electrically connecting the second sensor node electrode to the first electrode of the light receiving element.

20. The display device of claim 11, wherein a semiconductor region of each of the first sensor transistor and the third sensor transistor includes a silicon-based material, and a semiconductor region of the second sensor transistor includes an oxide-based material.

* * * * *